(12) United States Patent
Jiang et al.

(10) Patent No.: US 10,096,768 B2
(45) Date of Patent: Oct. 9, 2018

(54) MAGNETIC SHIELDING FOR MTJ DEVICE OR BIT

(71) Applicant: GLOBALFOUNDRIES Singapore Pte. Ltd., Singapore (SG)

(72) Inventors: Yi Jiang, Singapore (SG); Bharat Bhushan, Singapore (SG); Wanbing Yi, Singapore (SG); Juan Boon Tan, Singapore (SG); Pak-Chum Danny Shum, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 0 days.

(21) Appl. No.: 15/162,594

(22) Filed: May 23, 2016

(65) Prior Publication Data

US 2016/0351792 A1     Dec. 1, 2016

Related U.S. Application Data

(60) Provisional application No. 62/166,651, filed on May 26, 2015.

(51) Int. Cl.
| | |
|---|---|
| *H01L 43/02* | (2006.01) |
| *H01L 43/12* | (2006.01) |
| *H01L 43/08* | (2006.01) |
| *G11C 11/56* | (2006.01) |

(52) U.S. Cl.
CPC .......... *H01L 43/02* (2013.01); *G11C 11/5607* (2013.01); *H01L 43/08* (2013.01); *H01L 43/12* (2013.01); *H01L 2224/16225* (2013.01); *H01L 2224/73204* (2013.01); *H01L 2224/73253* (2013.01); *H01L 2924/15311* (2013.01); *H01L 2924/16152* (2013.01)

(58) Field of Classification Search
CPC ........................... H01L 43/02; G11C 11/5607
See application file for complete search history.

(56) References Cited

U.S. PATENT DOCUMENTS

| | | | |
|---|---|---|---|
| 7,545,662 B2 | 6/2009 | Wang et al. | |
| 7,772,679 B2 | 8/2010 | Chang et al. | |
| 8,796,046 B2 | 8/2014 | Chen et al. | |
| 9,252,108 B2 | 2/2016 | Fujimori | |
| 2006/0289970 A1 | 12/2006 | Gogl et al. | |
| 2010/0254182 A1 | 10/2010 | Kuroiwa et al. | |
| 2011/0198715 A1 | 8/2011 | Matsuoka et al. | |

(Continued)

*Primary Examiner* — Moazzam Hossain
*Assistant Examiner* — Farun Lu
(74) *Attorney, Agent, or Firm* — Horizon IP PTE LTD.

(57) ABSTRACT

Emerging memory chips and methods for forming an emerging memory chip are presented. For example, magnetic random access memory (MRAM) chip magnetic shielding at the device-level is disclosed. The MRAM chip includes a magnetic shield structure that is substantially surrounding a magnetic tunnel junction (MTJ) bit or device of a MTJ array. The magnetic shield may be configured in the form of a cylindrical shield structure or magnetic shield spacer that substantially surrounds the MTJ bit or device. The magnetic shield structure in the form of cylindrical shield structure or magnetic shield spacer may include top and/or bottom plate shield. The magnetic shield structure in various forms and configurations protect the MTJ stack from external or local magnetic fields. This magnetic shielding structure is applicable for both in-plane and perpendicular MRAM chips.

20 Claims, 37 Drawing Sheets

(56) References Cited

U.S. PATENT DOCUMENTS

| | | |
|---|---|---|
| 2011/0241140 A1 | 10/2011 | Tsujiuchi et al. |
| 2012/0193737 A1 | 8/2012 | Pang et al. |
| 2013/0249024 A1* | 9/2013 | Saida .................. H01L 43/08 257/421 |
| 2014/0001585 A1* | 1/2014 | Dimitrov ............. H01L 43/08 257/421 |
| 2014/0264679 A1* | 9/2014 | Lee ..................... H01L 43/12 257/427 |
| 2015/0091109 A1 | 4/2015 | Allinger et al. |
| 2015/0243607 A1 | 8/2015 | Jang et al. |
| 2015/0333018 A1 | 11/2015 | Kim et al. |
| 2016/0172580 A1 | 6/2016 | Matsubara et al. |

* cited by examiner

200c

200d

200e

200f

400

400

400

400

600

600

600

600

600

600

700

700

700

800

800

MAGNETIC SHIELDING FOR MTJ DEVICE OR BIT

CROSS-REFERENCE TO RELATED APPLICATION

This application claims the priority benefit of U.S. Provisional Application Ser. No. 62/166,651, filed on May 26, 2015, which is hereby incorporated by reference in its entirety for all purposes.

BACKGROUND

Magnetic random access memory (MRAM) is a non-volatile random access memory which gains popularity in recent years as potential replacement for dynamic random access memory (DRAM), static random access memory (SRAM) and flash. MRAM, for example, includes magnetic tunnel junction (MTJ) element which uses magnetic polarization to store information. For example, READ and WRITE operations of the MRAM device rely on the MTJ element. However, magnetic interferences can be a problem for MRAM devices. For instance, MTJ functions can be affected by an external or local magnetic field. The external or local magnetic fields not only distort or change the spins within the MTJ device or bit, but also induce changes on electrical signals of the circuits. READ and WRITE operations in MRAM devices are inevitably affected by external or local magnetic fields. These cause reliability issues in MRAM devices.

Accordingly, it is desirable to provide reliable and cost effective processing of magnetic shielding techniques to protect the MTJ device or bit from external or local magnetic fields.

SUMMARY

Embodiments of the present disclosure generally relate to semiconductor device and methods for forming a semiconductor device. In one aspect, a magnetic random access memory (MRAM) chip is disclosed. The MRAM chip includes a substrate having first and second surfaces. The first surface is defined with a MRAM region. An upper inter level dielectric (ILD) layer is disposed over the first surface of the substrate. The upper ILD layer includes a plurality of ILD levels. A magnetic storage element having a magnetic tunneling junction (MTJ) array with MTJ stack is disposed in between top and bottom electrodes in the MRAM region. The magnetic storage element is disposed in a dielectric layer in between adjacent ILD levels of the upper ILD layer. At least a magnetic shield structure is disposed in the same dielectric layer as the MTJ stack. The magnetic shield structure substantially surrounds the MTJ stack. The magnetic shield may be configured in the form of a cylindrical shield structure or magnetic shield spacer that substantially surrounds the MTJ stack. The magnetic shield structure in the form of cylindrical shield structure or magnetic shield spacer may include top and/or bottom plate shield. A pad level is disposed over the magnetic storage element. The pad level includes a die bond/bump pad coupled to the magnetic storage element.

In another aspect, a method for forming a magnetic random access memory (MRAM) chip is presented. The method includes providing a substrate having first and second surfaces. The first surface is defined with a MRAM region. An upper inter level dielectric (ILD) layer is formed over the first surface of the substrate. The upper ILD layer includes a plurality of ILD levels. A magnetic storage element having a magnetic tunneling junction (MTJ) array with MTJ stack is formed in between top and bottom electrodes in the MRAM region. The magnetic storage element is formed in a dielectric layer in between adjacent ILD levels of the upper ILD layer. At least a magnetic shield structure is provided in the same dielectric layer as the MTJ stack. The magnetic shield structure substantially surrounds the MTJ stack. A pad level is formed over the magnetic storage element. The pad level includes a die bond/bump pad coupled to the magnetic storage element.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following drawings, in which.

DETAILED DESCRIPTION

Embodiments of the present disclosure generally relate to MRAM chips or dies and methods for forming MRAM chip having one or more device-level magnetic shield protections. The MRAM chip or die, for example, may be spin transfer torque magnetic random access memory (STT-MRAM) chip. The MRAM chip includes MRAM cell having a MTJ element. Other suitable types of memory chips may also be useful. The MTJ element as will be described later in this disclosure includes one or more magnetic shield protection structures that substantially surround or disposed adjacent to the MTJ element so that it is protected against external or local magnetic interferences to prevent disturbance or change of spins in the MTJ element of the MRAM chip. Such MRAM chips or dies can be incorporated into standalone memories or embedded memories including, but not limited to, USB or other types of portable storage units, or ICs, such as microcontrollers or system on chips (SoCs). The devices or ICs may be incorporated into or used with, for example, consumer electronic products, or related to other types of gadgets.

Figure 1:
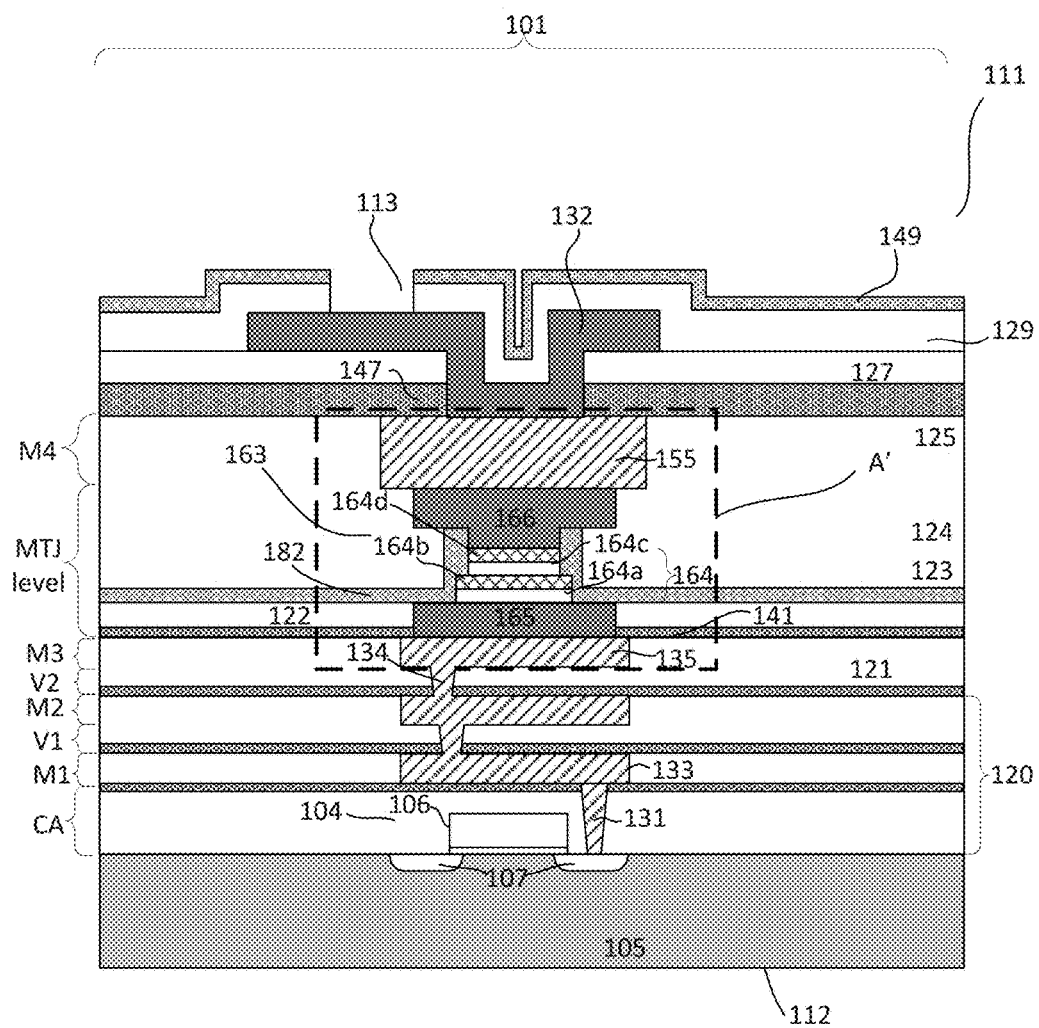
FIG. 1 shows a simplified cross-sectional view of an embodiment of a MRAM chip with a MTJ element or bit.

FIG. 1 shows a simplified cross-sectional view of an embodiment of a MRAM chip or die 110. The MRAM chip, for example, includes a MRAM cell such as a non-volatile memory (NVM) cell. The MRAM cell, in one embodiment, is a STT-MRAM cell having MTJ bit or element. Other suitable type of memory cell may also be useful.

The cross-sectional view, for example, is taken along a MRAM region 101 which is part of a prime die region of the die. The MRAM cell, for example, is disposed in the MRAM region of a substrate. The MRAM region, for example, may be an array region. For example, the array region may include a plurality of MRAM cell regions. For simplicity and illustration purpose, only one MTJ bit from an array of bits is shown. The substrate 105 may include other types of device regions (not shown in this cross-sectional view), such as logic, high voltage (HV), low voltage (LV) and intermediate voltage (IV) device regions. Other types of regions may also be provided.

As described, the MRAM cell is disposed on the substrate 105. The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, is formed from silicon dioxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

The substrate includes a first (front side) surface and a second (back side) surface 112. Front end of line (FEOL) processing is performed on the first surface of the substrate. The FEOL process, for example, forms n-type and p-type transistors in the MRAM region as well as other regions on the substrate. The p-type and n-type transistors, for example, may include complementary metal oxide semiconductor (CMOS) transistors and cell selector units. The FEOL processing, for example, includes forming isolation regions, various device and isolation wells, transistor gates and transistor source/drain (S/D) regions and contact or diffusion regions serving as substrate or well taps. Forming other components with the FEOL process may also be useful. For simplicity, only one transistor 104 and its gate 106 and S/D regions 107 are shown.

After the FEOL processing, back end of line (BEOL) processing is performed. The BEOL processing includes forming interconnects in interlevel dielectric (ILD) layers over the first surface of the substrate. The interconnects connect the various components of the integrated circuit (IC) to perform the desired functions. An ILD level includes a metal level and a via level. Generally, the metal level includes conductors or metal lines while the via level includes via contacts. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE), may also be employed to form metal lines.

A die may include a plurality of ILD layers or levels. For example, x number of ILD levels may be provided. As illustrated, the die includes 4 ILD levels (x=4). Other suitable number of ILD levels may also be useful. The number of ILD levels may depend on, for example, design requirements or the logic process involved. A metal level of an ILD level may be referred to as $M_i$, where i is from 1 to x and is the $i^{th}$ ILD level of x ILD levels. A contact level of an ILD level may be referred to as $V_{i-1}$, where i is the $i^{th}$ ILD level of x ILD levels.

The BEOL process, for example, commences by forming a dielectric layer over the transistors and other components formed in the FEOL process. The dielectric layer may be, for example, silicon dioxide formed by chemical vapor deposition (CVD). The dielectric layer serves as a premetal dielectric layer or first contact layer of the BEOL process. The dielectric layer may be referred to as CA level of the BEOL process. Contacts 131 are formed in the CA level dielectric layer by using mask and etch techniques. A conductive layer, such as tungsten, may be deposited on the substrate by sputtering.

Conductive lines 133 are formed in the M1 level dielectric layer over the CA level. The conductive lines may be formed by a damascene technique using, for example, mask and etch techniques. The conductive material such as copper or copper alloy may be formed by, for example, plating, such as electro or electroless plating. The first metal level M1 and CA may be referred as a lower ILD level.

The process continues to form additional ILD layers or upper ILD layers/levels. The additional ILD levels may include ILD level 2 to ILD level x. For example, in the case where x=4 (4 levels), the additional levels include ILD levels from 2 to 4, which include metal levels M2 to M4 and via levels V1 to V3. The number of ILD layers may depend on, for example, design requirements or the logic process involved. The ILD layers may be formed of silicon dioxide. Other types of dielectric materials, such as low k, or a combination of dielectric materials may also be useful. The ILD layers may be formed by, for example, CVD. Other techniques for forming the ILD layers may also be useful.

The conductors and contacts of the additional ILD layers may be formed by dual damascene techniques. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, PVD and plating techniques. Excess conductive material is removed by, for example, CMP, forming conductors and contacts in an ILD layer.

For simplicity and for illustration purpose, the ILD layers from CA level to M2 level may be collectively referred to as lower ILD layers 120 and dielectric liners, such as NBLoK, may be disposed in between adjacent ILD layers. As shown, a dielectric layer 121 is disposed over the lower ILD layers 120. For illustration purpose, the dielectric layer 121 may be referred to as a first upper dielectric layer and corresponds to ILD level 3. The ILD level 3, for example, includes a via level and a metal level. The ILD level 3, for example, includes via level V2 and metal level M3. One or more via contacts 134 may be disposed in V2 while one or more metal lines 135 may be disposed in M3. The metal line 135, for example, includes a conductive material, such as Cu.

A dielectric liner 141 is disposed over the first upper dielectric layer 121 covering the metal line 135. The dielectric liner, for example, serves as an etch stop layer. The dielectric liner may be a low k dielectric liner. For example, the dielectric liner may be NBLoK. Other suitable types of dielectric materials for the dielectric liner may also be useful.

A second upper dielectric layer 122 is disposed on the first upper dielectric layer 121 with the dielectric liner 141 in between. The second upper dielectric layer, in one embodiment, is Tetraethyl orthosilicate (TEOS). Any suitable dielectric materials and thicknesses for the second upper dielectric layer may be useful.

As shown in FIG. 1, the MRAM region accommodates a magnetic storage element 163 to form a MTJ bit cell, such as a STT-MRAM cell. In one example, the magnetic storage element is disposed in ILD level 4. ILD level 4, for example, includes a MTJ level and metal level M4. The magnetic storage element, as shown, is disposed in a dielectric layer between adjacent metal levels of upper ILD level. For illustration purpose, the magnetic storage element, is disposed in a dielectric layer which corresponds to the MTJ level in between metal levels M3 and M4. It is understood that the magnetic storage element may be disposed in between any suitable adjacent metal levels.

The magnetic storage element, in one embodiment, includes a MTJ bit element having a MTJ stack 164. The MTJ stack may be disposed between first and second electrodes. The first electrode 165, for example, may be a bottom electrode while the second electrode 166 may be a top electrode. The bottom electrode 165, for example, is disposed in the second upper dielectric layer 122 and extends through the dielectric liner 141 and is connected to the metal line 135. For illustration purpose, the MTJ stack 164, for example, includes four layers 164a-164d. It is understood that the MTJ stack may include any suitable number of layers. For example, the MTJ stack generally includes a magnetically fixed (pinned) layer, one or more tunneling barrier layers and a magnetically free layer. The MTJ stack, for example, may include a bottom-pinned MTJ stack or a top-pinned MTJ stack. Top and bottom refer to position of layers relative to the substrate surface. The magnetic layers of the MTJ stack, for example, may have magnetic orientations in perpendicular or in-plane direction. The MTJ stack, as illustrated, is a simplified MTJ stack. An actual MTJ stack may include other suitable layers.

By way of example, the free layer and the fixed layer may be CoFeB or CoFe based composite material and the tunneling barrier layer may be MgO or $Al_2O_3$. As for the top and bottom electrodes, they may be Ti, TiN, TaN or Ta. Other suitable materials for the MTJ element may also be useful. The various layers of the MTJ stack and the top and bottom electrodes may be formed using suitable deposition techniques, including physical vapor deposition (PVD) and may be patterned using suitable mask and etch technique to achieve a desired configuration.

The top electrode and upper layers of the MTJ stack of the magnetic storage element, for example, include a length dimension which is smaller than a length dimension of the bottom electrode and lower layers of the MTJ stack. An encapsulation liner 182 may be provided to protect portions of the MTJ stack. The encapsulation liner, for example, may include SiN or other suitable dielectric materials. Other suitable configurations of the MTJ stack may also be useful.

A dielectric layer is disposed over the second upper dielectric layer 122, covering the magnetic storage element. The dielectric layer and the second upper dielectric layer 122, in one embodiment, correspond to upper ILD level 4. The dielectric layer may be a dielectric stack having two or more upper dielectric layers (e.g., upper dielectric layers 123, 124, 125). The dielectric stack includes TEOS and may be formed by CVD. Other suitable configurations, materials and forming techniques for the dielectric layer may also be useful.

The dielectric layer 125 for example, includes a metal line 155. The metal line 155, for example, is disposed in metal level M4 and is coupled to the top electrode. The metal line 155, for example, may be referred to as the top metal line and may serve as a bitline (BL). Providing the bitline at other metal levels may also be useful. Although one metal line 155 is shown, it is understood that there could be other suitable number of metal lines in the same metal level.

The dimensions of this metal line 155, for example, may be defined at twice the minimum line resolution of the lithography and etch capability for a technology process node, which may be referred to as 2× design rule. For example, the thickness of the top metal line 155, for example, may be at least 2 times greater than the thickness of the metal line 135 below. The top metal line includes a conductive material, such as Cu. Other suitable configurations and conductive materials for the metal line may also be useful.

In one embodiment, one or more magnetic shield structures may be provided to substantially surround or adjacent or proximate to the MTJ stack. The magnetic shield structure includes a magnetic shield material that does not function by excluding a magnetic field from itself, but rather by collecting and concentrating the magnetic field lines into itself and thereby diverting the field from the magnetically sensitive components to be protected. For example, the magnetic shield material or layer includes Ni, Fe, NiFe (Mµmetal). Other suitable magnetic shield materials may also be useful. For simplicity, the magnetic shield structure which is provided to be substantially surrounding the MTJ stack is not shown in FIG. 1. The magnetic shield structure may be provided in various forms and configurations which will be described in detail and shown in FIGS. 2a-2g later. The magnetic shield structure protects the MTJ bit or element from external and local magnetic fields.

A pad level is disposed over the uppermost ILD level and may be referred to as a first surface (or front side) 111 of the MRAM chip or die 110. The pad level, for example, is disposed over Mx. In the case where the device includes 4 metal levels as illustrated in FIG. 1, the pad level is disposed over M4. The pad level includes a pad dielectric stack. The pad dielectric stack, for example, includes a first pad dielectric layer 147 disposed over the dielectric layer 125 and a second pad dielectric layer 127 disposed over the first pad dielectric layer. For example, the first pad dielectric layer includes silicon nitride while the second pad dielectric layer includes TEOS. The first and second pad dielectric layers may be formed by CVD. Other suitable dielectric materials and forming techniques may also be useful. As shown, a pad interconnect having a pad via contact and a die bond/bump pad 132 is disposed in the pad level. The pad via contact is disposed in a pad opening that extends from the top surface of the second pad dielectric layer to the bottom surface of the first pad dielectric layer while the die bond/bump pad 132 is disposed over the top surface of the second pad dielectric layer. The pad interconnect is coupled to the metal line 155 in the uppermost ILD level (e.g., M4). The pad interconnect, for example, includes an aluminum pad interconnect and may be formed by sputtering. Other suitable conductive materials and forming techniques may also be useful.

A passivation layer may be disposed over the pad dielectric layer. The passivation layer, in one embodiment, includes a passivation stack having first and second passivation layers. For example, the first passivation layer 129 is disposed over the pad dielectric layers and includes a passivation oxide layer while the second passivation layer 149 is disposed over the first passivation layer and includes a passivation nitride layer. Other suitable passivation materials may also be useful.

One or more die bond/bump pad openings 113 are defined through a portion of the passivation layers and exposes a portion of the underlying die bond/bump pad 132. The opening 113 which exposes the die bond/bump pad may be configured to provide wire bonding to external devices. Alternatively, the opening 113 may be configured for receiving a die microbump (not shown) which is attached to the exposed die bump pad 132 and allows the chip or die to be electrically coupled to an external device.

FIGS. 2a-2g show enlarged cross-sectional views of a portion A' of the MRAM chip 110 shown in FIG. 1. FIGS. 2a-2g show various forms and configurations of a magnetic shield structure which substantially surrounds or adjacent or proximate to the MTJ stack. FIGS. 2a-2g may include elements and features that have already been described in FIG. 1. As such, common elements or features having the same reference numerals may not be described or described in detail. For simplicity, components formed by FEOL processing and lower ILD levels will not be described or repeated.

Figure 2A:
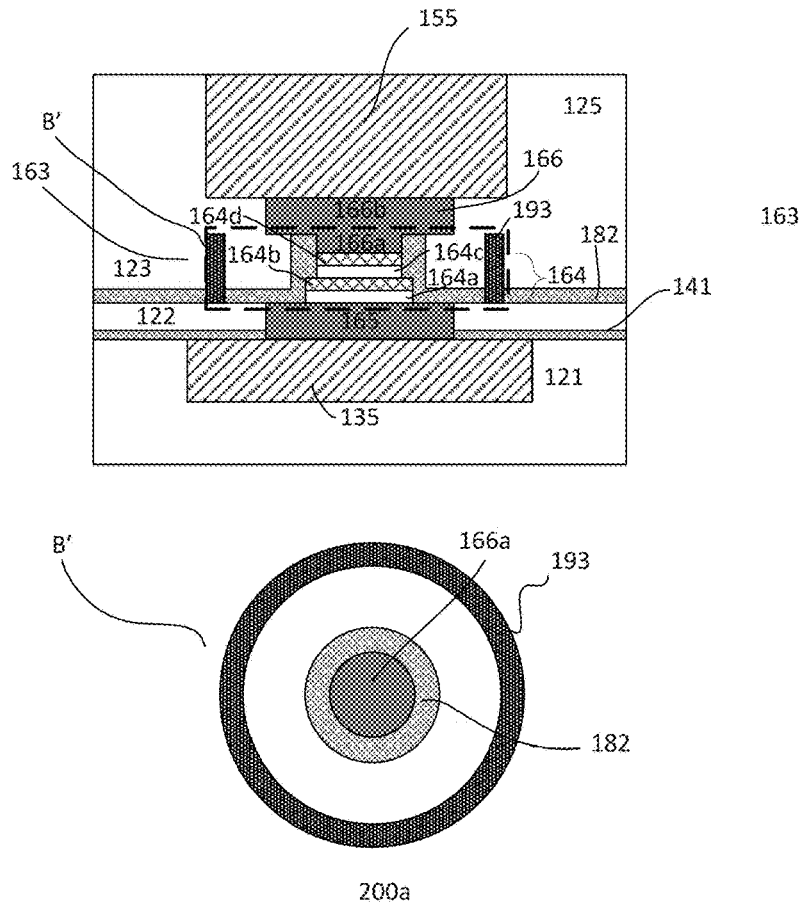
FIG. 2a shows a cross-sectional view of an embodiment of MTJ element or bit with a cylindrical shield structure.

Referring to FIG. 2a, a portion A' of the MRAM chip is shown. As shown in FIG. 2a, the MRAM region accommodates a MRAM cell. The MRAM cell includes a storage or memory element, such as a MTJ element, which is disposed in between adjacent final metal levels of upper ILD level of the device. In one example, the MTJ element is formed in between adjacent upper ILD levels, such as upper ILD level 3 to 4. It is understood that the MTJ element of the MRAM cell may be disposed in between any suitable adjacent ILD levels. For illustration purpose, the enlarged cross-sectional view of the device shown in FIG. 2a shows the first upper dielectric layer 121 which corresponds to ILD level 3. The dielectric layer 121, for example, includes a via level and a metal level. The ILD level 3, for example, includes via level V2 and metal level M3. One or more via contacts (not shown) may be disposed in V2 while one or more metal lines 135 may be disposed in metal level M3 of the first upper dielectric layer.

A second upper dielectric layer 122 is disposed on the first upper dielectric layer 121 with the dielectric liner 141 in between. A magnetic storage element 163 is disposed in ILD level 4 which includes a MTJ level and metal level M4. The magnetic storage element, in one embodiment, includes a MTJ bit element having a MTJ stack 164. For illustration purpose, the MTJ stack 164, for example, includes four layers 164a-164d. It is understood that the MTJ stack may include any suitable number of layers. As shown, the MTJ stack is disposed between the bottom electrode 165 and the top electrode 166. The bottom electrode 165, for example, is disposed in the second upper dielectric layer 122 and extends through the dielectric liner 141 and is connected to the metal line 135. As for the top electrode 166, in one embodiment, it includes a lower top electrode portion 166a coupled to the MTJ stack and an upper top electrode portion 166b which is disposed over the encapsulation liner 182. The encapsulation liner protects exposed sidewalls of the MTJ stack and exposed top surface of the second upper dielectric layer 122.

In one embodiment, a magnetic shield structure 200a that substantially surrounds the MTJ stack is disposed in a third upper dielectric layer 123 of the MTJ level. In one embodiment, the magnetic shield is in the form of a cylindrical shield structure 193 that substantially surrounds the MTJ stack and extends through the dielectric liner 182. The magnetic shield may also include other suitable shapes as long as it substantially surrounds the MTJ stack. Referring to FIG. 2a, the third upper dielectric layer includes a trench in the form of a cylindrical or annular ring structure filled with a magnetic shield material or layer surrounding or adjacent to the MTJ stack when viewed from its corresponding top view B'. This forms a cylindrical magnetic shield that substantially surrounds the MTJ stack when viewed from top. As shown, the cylindrical magnetic shield is isolated from the MTJ stack by a portion of the third upper dielectric layer 123 which is disposed in between the cylindrical magnetic shield and the MTJ stack. The cylindrical magnetic shield, for example, includes a top surface that is substantially coplanar with the top surface of the encapsulation liner 182. The top surface of the cylindrical magnetic shield, for example, includes a top surface that is below the upper top electrode portion of the top electrode 166.

A fourth upper dielectric layer 125 is disposed over the cylindrical shield and the MTJ stack. The fourth upper dielectric layer, for example, corresponds to metal level M4.

The dielectric layer 125 for example, includes a metal line 155. The metal line 155, for example, is disposed in metal level M4 and is coupled to the top electrode 166. The metal line 155, for example, may be referred to as the top metal line and may serve as a bitline (BL). Providing the bitline at other metal levels may also be useful.

Figure 2B:
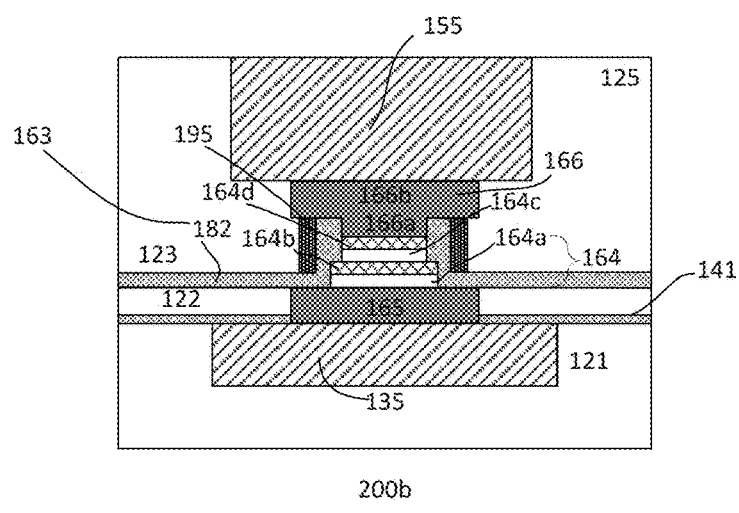
FIG. 2b shows a cross-sectional view of an embodiment of MTJ element or bit with a spacer shield structure.

FIG. 2b shows another configuration of a magnetic shield structure 200b that substantially surrounds the MTJ stack. Common elements and features having the same reference numerals may not be described or described in detail. In the interest of brevity, the description of FIG. 2b below primarily focuses on the difference(s) compared with the configuration 200a shown in FIG. 2a.

In one embodiment, a magnetic shield structure 200b that substantially surrounds the MTJ stack is disposed in a third upper dielectric layer 123 of the MTJ level. In one embodiment, the magnetic shield is in the form of a magnetic shield spacer 195 that substantially surrounds the MTJ stack 164. Referring to FIG. 2b, the magnetic shield in the form of magnetic shield spacer abuts the sidewall of the encapsulation liner 182 and substantially surrounds the MTJ stack. As shown, the magnetic shield spacer includes a top surface that is substantially coplanar with the top surface of the encapsulation liner 182. The top surface of the magnetic shield spacer, for example, includes a top surface that is below the upper top electrode portion of the top electrode 166.

Figure 2C:
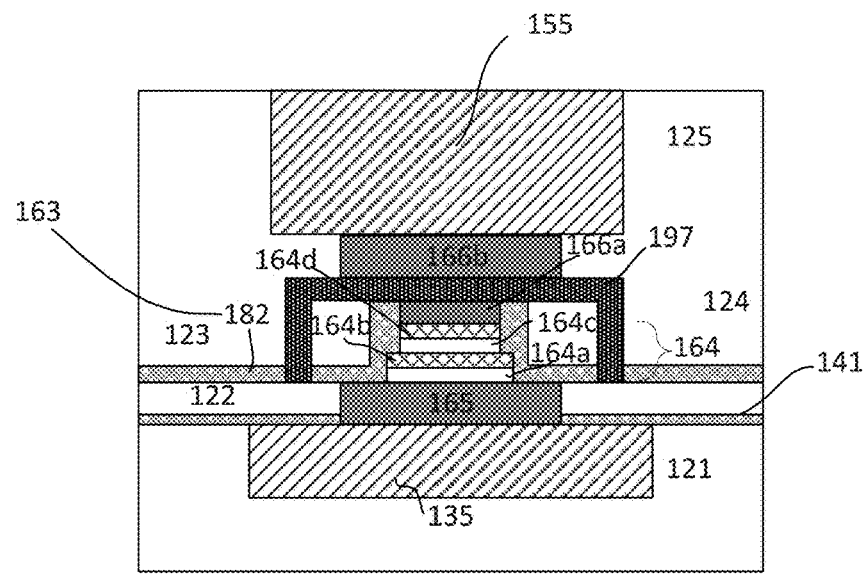
FIG. 2c shows a cross-sectional view of an embodiment of MTJ element or bit with a cylindrical shield structure with a top plate shield.

FIG. 2c shows another configuration of a magnetic shield structure 200c that substantially surrounds the MTJ stack. Common elements and features having the same reference numerals may not be described or described in detail. In the interest of brevity, the description of FIG. 2c below primarily focuses on the difference(s) compared with the configuration 200a shown in FIG. 2a.

In one embodiment, a magnetic shield structure 200c that substantially surrounds the MTJ stack is disposed in the dielectric layer of the MTJ level. In one embodiment, the magnetic shield is in the form of a cylindrical shield structure with a first (or top) plate shield 197 that substantially surrounds the MTJ stack. In one embodiment, the magnetic shield is in the form of a cylindrical structure with the top plate shield that substantially surrounds the MTJ stack and extends through the dielectric liner 182. The magnetic shield may also include other suitable shapes as long as it substantially surrounds the MTJ stack. The cylindrical shield portion, for example, is disposed in the third upper dielectric layer 123 while the top plate shield is disposed in the fourth upper dielectric layer 124 of the MTJ level. Referring to FIG. 2c, the cylindrical shield structure and the top plate shield, in one embodiment, is a single unitary unit which includes a magnetic shield material as described in FIG. 1. As shown, outer edges of the top plate shield and cylindrical shield structure are aligned to each other. Similar to the magnetic shield 200a shown in FIG. 2a, the cylindrical shield portion of the magnetic shield 200c shown in FIG. 2c is also isolated from the MTJ stack by a portion of the third upper dielectric layer 123 which is disposed in between the cylindrical magnetic shield and the MTJ stack.

In one embodiment, the top electrode includes a lower top electrode portion 166a and an upper top electrode portion 166b. The lower and top electrode portions are separated from each other by the top plate shield 197 as shown in FIG. 2c. the lower and top electrode portions are made of the same conductive material as the top electrode 166 as described in FIG. 1. A fifth upper dielectric layer 125 is disposed over and covers the cylindrical shield with top plate shield and the MTJ stack. The dielectric layer 125, for example, corresponds to metal level M4. The dielectric layer 125, for example, includes a metal line 155. The metal line 155, for example, is disposed in metal level M4 and is coupled to the upper top electrode portion 166b.

Figure 2D:
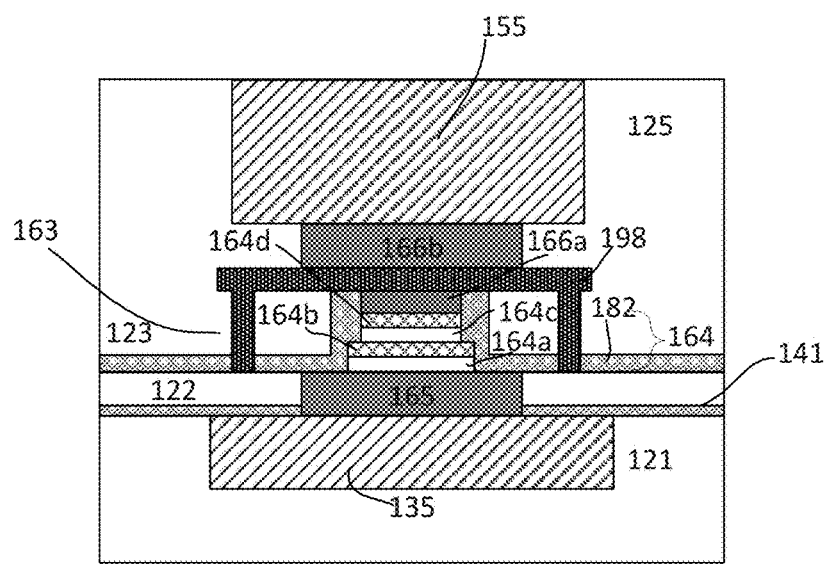
FIG. 2d shows a cross-sectional view of another embodiment of MTJ element or bit with a cylindrical shield structure with a top plate shield.

FIG. 2d shows another configuration of a magnetic shield structure 200d that substantially surrounds the MTJ stack. Common elements and features having the same reference numerals may not be described or described in detail. In the interest of brevity, the description of FIG. 2d below primarily focuses on the difference(s) compared with the configuration 200c shown in FIG. 2c.

In one embodiment, a magnetic shield structure 200d that substantially surrounds the MTJ stack is disposed in the dielectric layer of the MTJ level. In one embodiment, the magnetic shield 200d is similar to the magnetic shield 200c. For example, the magnetic shield 200d is in the form of a cylindrical shield structure with a first (or top) plate shield 198 that substantially surrounds the MTJ stack. In one embodiment, the magnetic shield 200d differs from the magnetic shield 200c in that the top plate shield 198 has an outer edge that extends beyond the outer edge of the cylindrical shield portion. Referring to FIG. 2d, the cylindrical shield structure and the top plate shield, in one embodiment, include a magnetic shield material as described in FIG. 1 and are formed as a single unitary unit as will be described in FIGS. 7a-7e later.

Figure 2E:
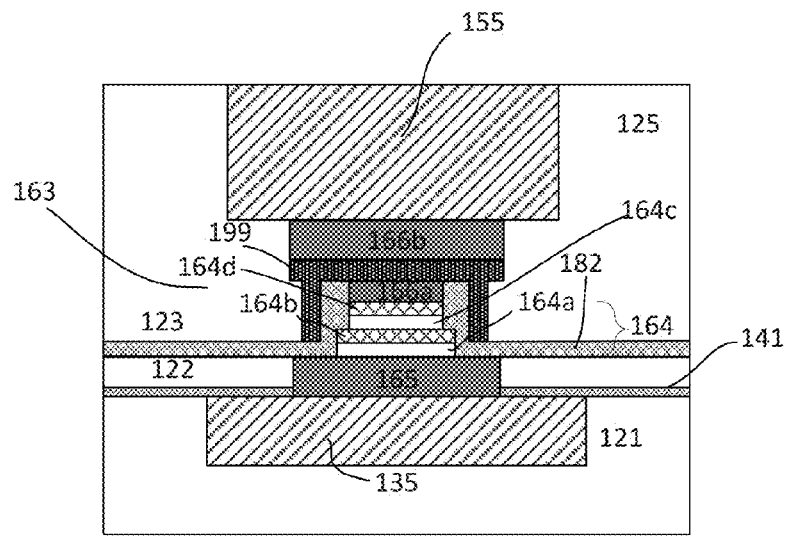
FIG. 2e shows a cross-sectional view of an embodiment of MTJ element or bit with a spacer shield structure with a top plate shield.

FIG. 2e shows another configuration of a magnetic shield structure 200e that substantially surrounds the MTJ stack. Common elements and features having the same reference numerals may not be described or described in detail. In the interest of brevity, the description of FIG. 2e below primarily focuses on the difference(s) compared with the configuration 200b shown in FIG. 2b.

In one embodiment, a magnetic shield structure 200e that substantially surrounds the MTJ stack is disposed in a third upper dielectric layer 123 of the MTJ level. In one embodiment, the magnetic shield is in the form of a magnetic shield spacer with a first (or top) plate shield 199 that substantially surrounds the MTJ stack. Referring to FIG. 2e, the magnetic shield in the form of magnetic shield spacer abuts the sidewall of the encapsulation liner 182 and the top plate shield is disposed over the MTJ stack. Referring to FIG. 2e, the magnetic shield spacer and the top plate shield, in one embodiment, includes a magnetic shield material as described in FIG. 1 and are formed separately as will be described in FIGS. 8a-8d later. As shown, outer edge of the top plate shield extends beyond outer edge of the magnetic shield spacer.

In one embodiment, the top electrode includes a lower top electrode portion 166a and an upper top electrode portion 166b. The lower and top electrode portions are separated from each other by the top plate shield 199 as shown in FIG. 2e. As shown, outer edge of the upper top electrode portion 166b and outer edge of the top plate shield are aligned to each other. The lower and top electrode portions are made of the same conductive material as the top electrode 166 as described in FIG. 1. A fifth upper dielectric layer 125 is disposed over and covers the magnetic shield spacer with top plate shield and the MTJ stack. The dielectric layer 125, for example, corresponds to metal level M4. The dielectric layer 125, for example, includes a metal line 155. The metal line 155, for example, is disposed in metal level M4 and is coupled to the upper top electrode portion 166b.

Figure 2F:
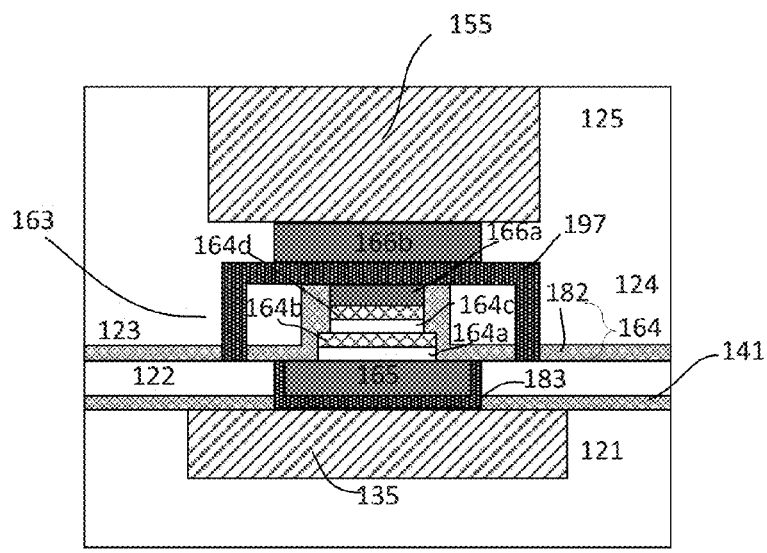
FIG. 2f shows a cross-sectional view of an embodiment of MTJ element or bit with a cylindrical shield structure with top and bottom plate shields.

FIG. 2f shows another configuration of a magnetic shield structure 200f that substantially surrounds the MTJ stack. Common elements and features having the same reference numerals may not be described or described in detail. In the interest of brevity, the description of FIG. 2f below primarily focuses on the difference(s) compared with the configuration 200c shown in FIG. 2c.

In one embodiment, a magnetic shield structure 200f that substantially surrounds the MTJ stack is disposed in the dielectric layer of the MTJ level. In one embodiment, the magnetic shield is in the form of a cylindrical shield structure with a first (or top) plate shield 197 and a second (or bottom) plate shield 183 that substantially surrounds the MTJ stack. Referring to FIG. 2f, the magnetic shield structure 200f differs from the magnetic shield structure 200c in that the magnetic shield structure 200f further includes a bottom plate shield disposed in a trench which accommodates the bottom electrode 165 in the second upper dielectric layer 122. As shown, the bottom plate shield includes a magnetic shield material and lines the sidewalls and bottom of the trench while the bottom electrode 165 is disposed over the bottom plate shield. The top surface of the bottom plate shield is substantially coplanar with top surfaces of the bottom electrode 165 and second upper dielectric layer 122.

Figure 2G:
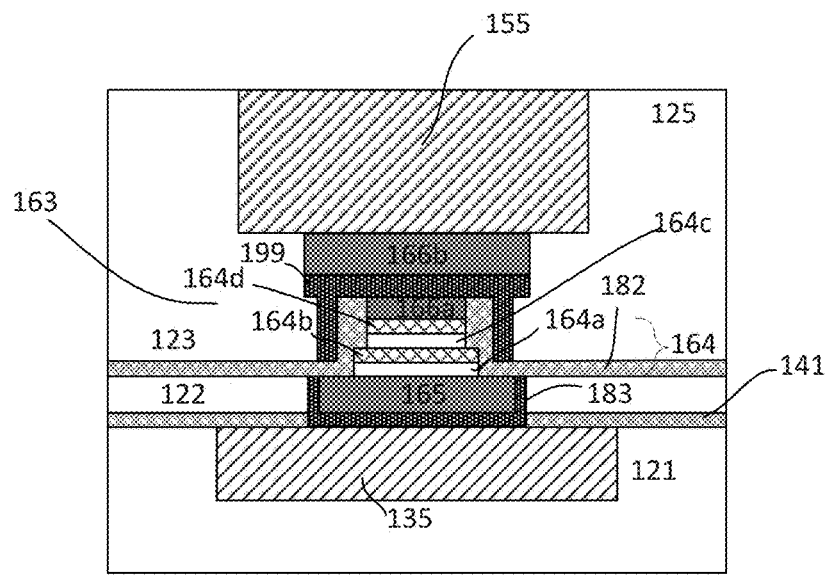
FIG. 2g shows a cross-sectional view of an embodiment of MTJ element or bit with a spacer shield structure with top and bottom plate shields.

FIG. 2g shows another configuration of a magnetic shield structure 200g that substantially surrounds the MTJ stack. Common elements and features having the same reference numerals may not be described or described in detail. In the interest of brevity, the description of FIG. 2g below primarily focuses on the difference(s) compared with the configuration 200e shown in FIG. 2e.

In one embodiment, a magnetic shield structure 200g that substantially surrounds the MTJ stack is disposed in the dielectric layer of the MTJ level. In one embodiment, the magnetic shield is in the form of a magnetic shield spacer with a first (or top) plate shield 199 and a second (or bottom) plate shield 183 that substantially surrounds the MTJ stack. Referring to FIG. 2g, the magnetic shield structure 200g differs from the magnetic shield structure 200e in that the magnetic shield structure 200g further includes a bottom plate shield 183 disposed in a trench which accommodates the bottom electrode 165 in the second upper dielectric layer 122. As shown, the bottom plate shield includes a magnetic shield material and lines the sidewalls and bottom of the trench while the bottom electrode 165 is disposed over the bottom plate shield. The top surface of the bottom plate shield is substantially coplanar with top surfaces of the bottom electrode 165 and second upper dielectric layer 122.

The embodiments as described in FIGS. 2a-2g provide for device level magnetic shielding. As described and illustrated in FIGS. 2a-2g, the magnetic shield may be configured in the form of a cylindrical shield structure or magnetic shield spacer that substantially surrounds the MTJ stack. In some embodiments, the magnetic shield structure in the form of cylindrical shield structure or magnetic shield spacer may include top plate shield. In other embodiments, the magnetic shield structure in the form of cylindrical shield structure or magnetic shield spacer may include both top plate shield and bottom plate shield. The magnetic shield structure in various forms and configurations protect the MTJ stack from external or local magnetic fields.

Figure 3:
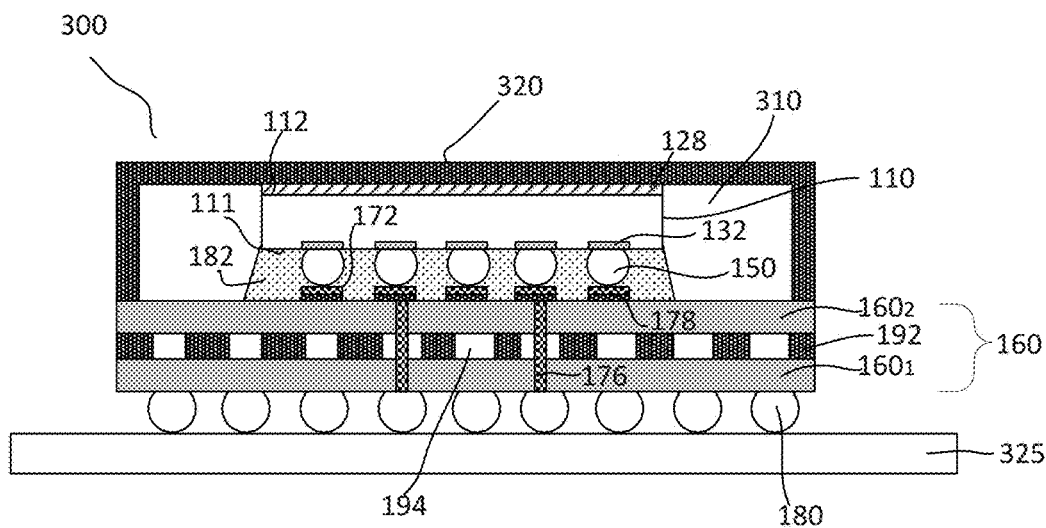
FIG. 3 shows an exemplary cross-sectional view of an embodiment of a MRAM chip with magnetic shielding in the device level, chip level and package level.

As described, the embodiments as presented in FIGS. 2a-2g provide for device level magnetic shielding. The MRAM chip or die 110 as described in this disclosure may be electrically connected to an external device, such as a package substrate, to form a semiconductor package. FIG. 3 shows an exemplary embodiment of a MRAM assembly or package 300. In one embodiment, a die or chip 110 as described in this disclosure is mounted to a die attach region defined on the first surface (top surface) of the package substrate 160. For illustration purpose, the die includes a flip chip die. Thus, the die disposed on the package substrate 160 may include a singulated die 110 having any one of the various magnetic shield configurations 200a-200g as described in FIGS. 2a-2g of this disclosure. It is understood that the MRAM package 300 may be modified to include a wire bonded die. The MRAM package 300 may be coupled to an external substrate, such as a printed circuit board (PCB) 325.

The MRAM assembly or package 300 may further include one or more magnetic shield materials disposed on different locations of the assembly to provide for package level magnetic shielding. As an example, magnetic permeable underfill dielectric material 182 may be provided in the space between the die and the top surface of the package substrate 160. In addition, magnetic shield traces 178 may be disposed below the package contact traces 172 over the top surface of the package substrate. Moreover, the package substrate 160 may include first and second package substrate layers $160_1$ and $160_2$ having a magnetic shield layer 192 with dielectric vias 194 sandwiched therebetween and through-hole contacts 176 coupling the die microbumps 150 to the package balls 180. A description of magnetic shield materials or layers provided on the package level is provided in, for example, co-pending U.S. patent application Ser. No. 15/080,541, filed on Mar. 24, 2016, entitled "Magnetic Shielding of MRAM Package", which is herein incorporated by reference for all purposes. Further, the MRAM package 300 may include a magnetic shield cap 320 which encapsulates the die or chip and top surface of the package substrate and attached to the die through an adhesive 128. The MRAM package may also include a magnetic permeable interface dielectric material 310 that fills the space between the die and the cap as shown in FIG. 3. The magnetic shield cap 320, for example, may include the same material as the magnetic shield layer as described in this disclosure while the magnetic permeable interface dielectric material 310 may include the same material as the magnetic permeable underfill dielectric material 182. Moreover, the MRAM chip may have one or more chip-level magnetic shield protections (not shown) which include front side magnetic shield, sidewall/spacers magnetic shield, lateral magnetic shield and/or back side magnetic shield. A description of magnetic shield materials or layers provided on the chip-level is provided in, for example, co-pending U.S. patent application Ser. No. 15/080,562, filed on Mar. 24, 2016, entitled "MRAM Chip Magnetic Shielding", which is herein incorporated by reference for all purposes.

Figure 4A:
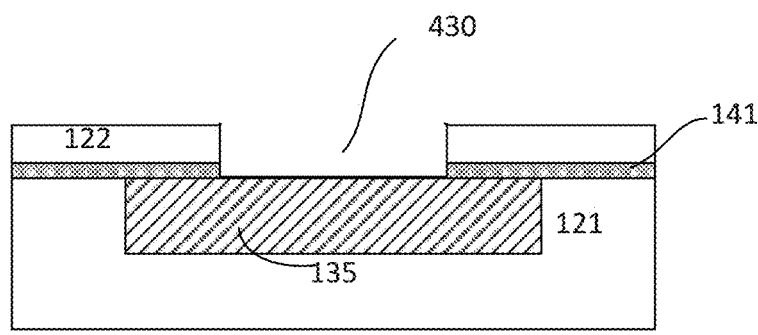
FIGS. 4a-4o show an exemplary embodiment of a process flow for forming a MTJ element or bit with a cylindrical shield structure.
Figure 4B:
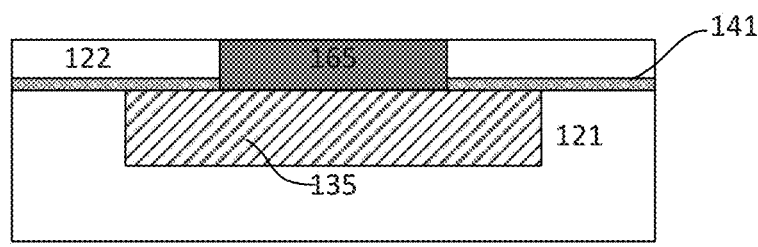
Figure 4C:
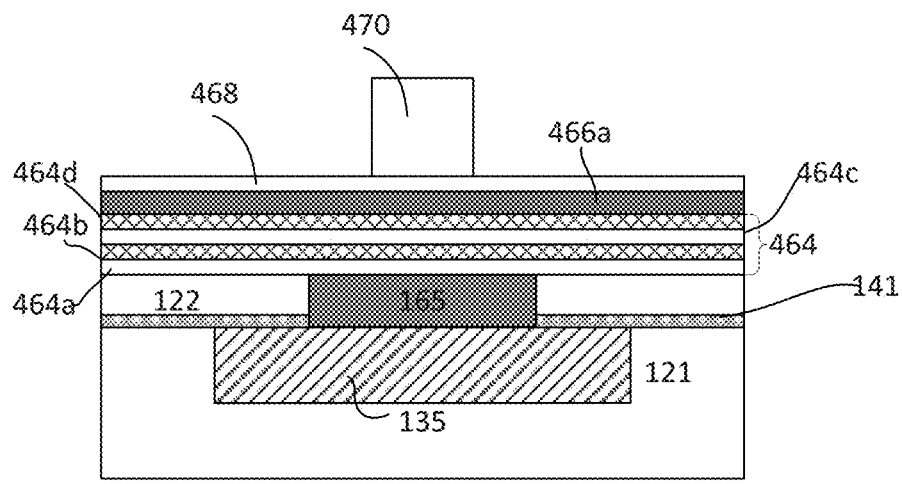
Figure 4D:
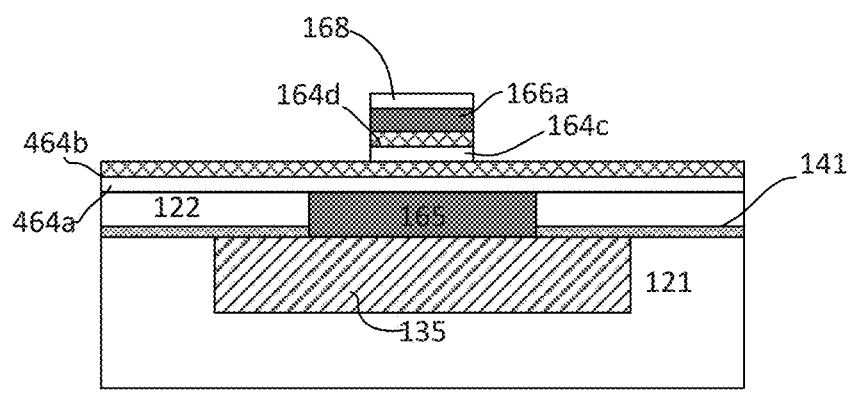
Figure 4E:
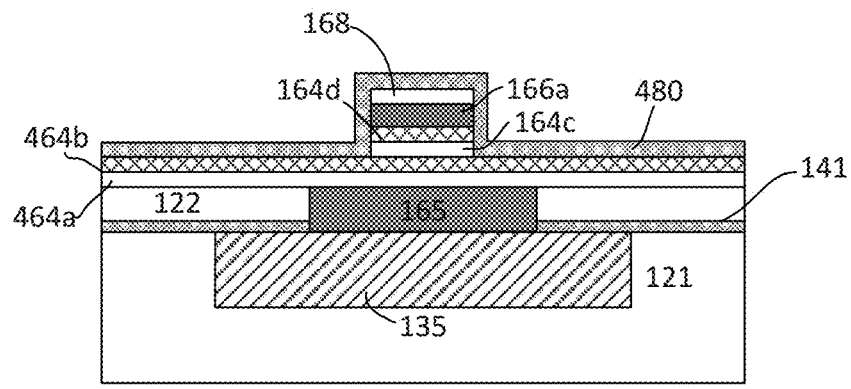
Figure 4F:
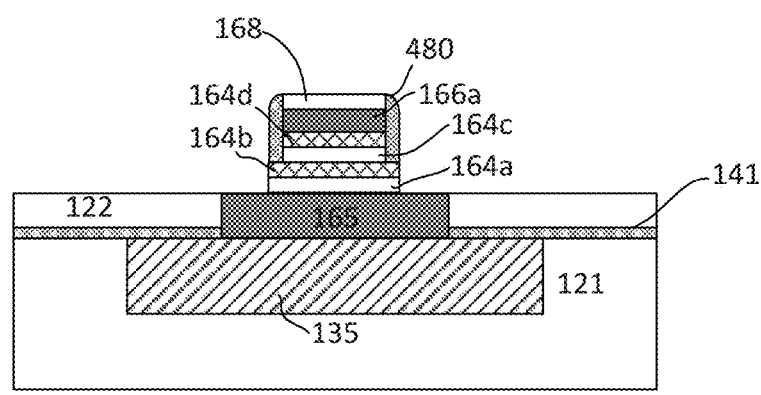
Figure 4G:
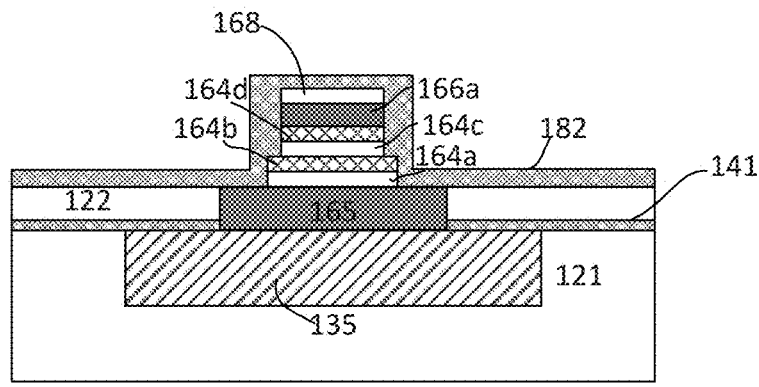
Figure 4H:
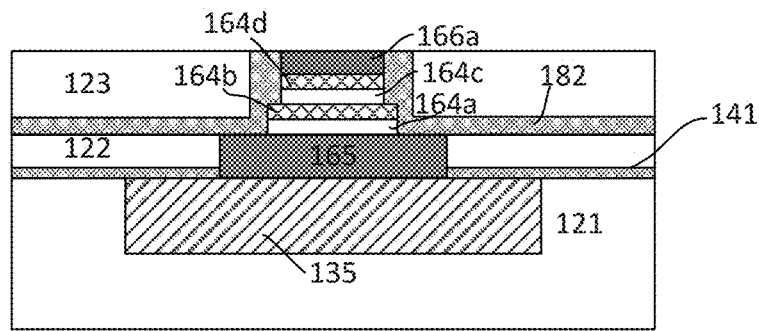
Figure 4I:
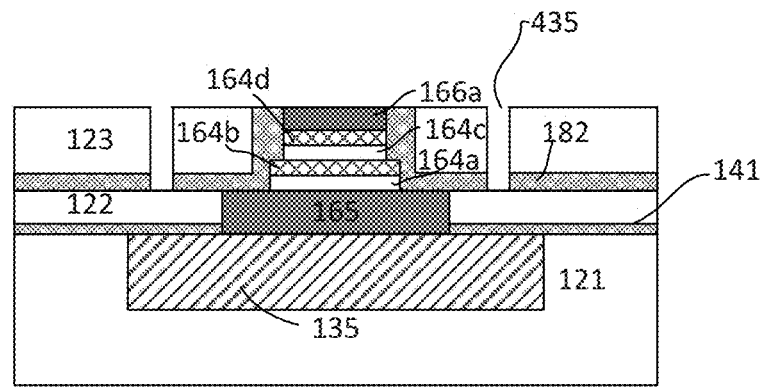
Figure 4J:
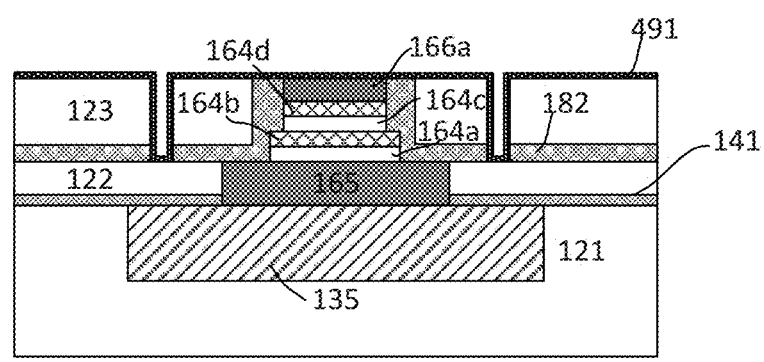
Figure 4K:
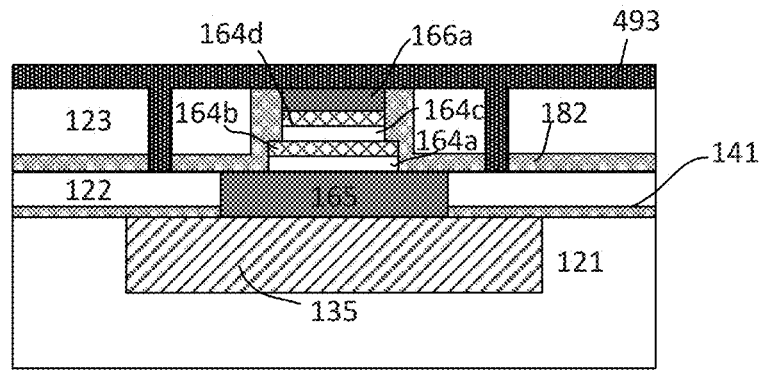
Figure 4L:
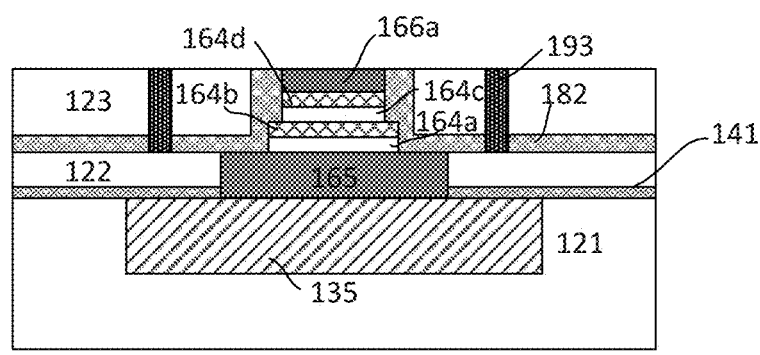
Figure 4M:
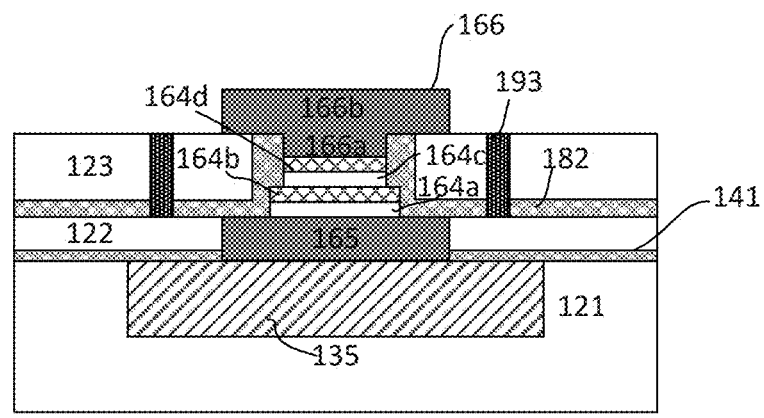
Figure 4N:
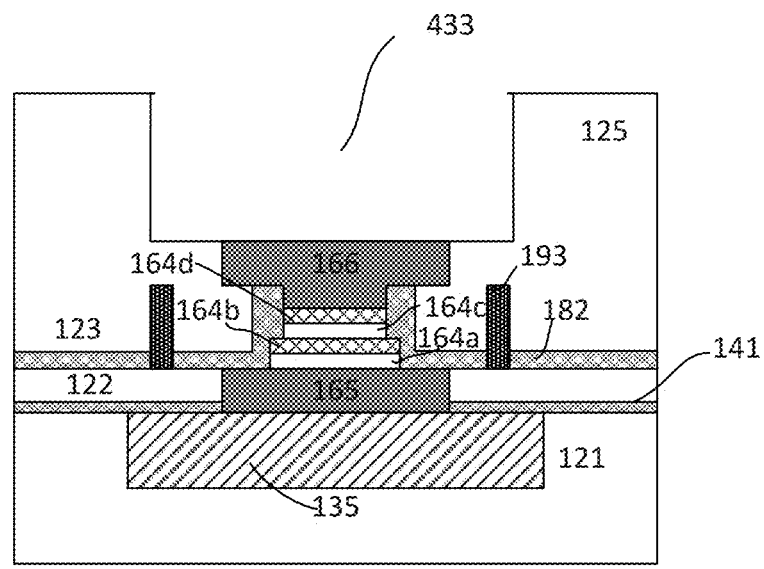
Figure 4O:
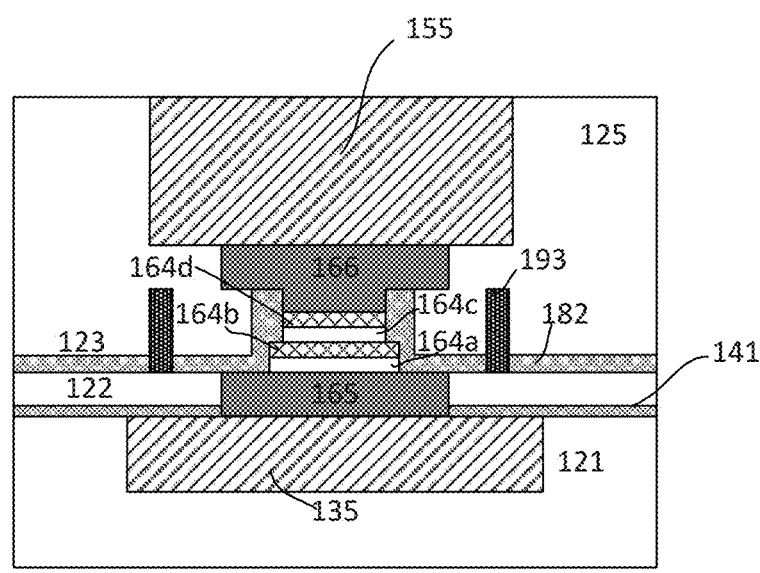

FIGS. 4a-4o show simplified cross-sectional views of a process flow 400 for forming an embodiment of a device. The cross-sectional views of the process 400 are taken along a MRAM region 101 of the device. In one embodiment, the process allows a memory cell to be formed. The memory cell, for example, may be a MRAM cell. The MRAM, in one embodiment, is a STT-MRAM cell. The device formed, for example, includes the magnetic shield configuration or structure 200a shown and described in FIG. 2a. As such, common elements may not be described or described in detail.

For simplicity, the processing of a substrate to form transistors using FEOL and processing of lower ILD level and lower levels of an upper ILD level using BEOL are not shown. Referring to FIG. 4a, the process 400 is at the stage of providing a dielectric layer 121 over a substrate (not shown). The dielectric layer 121, for example, may correspond to upper ILD level 3 having via level V2 and metal level M3. For the sake of simplicity and for illustration purpose, the dielectric layer 121 may be referred to as a first upper dielectric layer and its via and metal levels may be referred to as a first upper interconnect level. The dielectric layer 121 is formed of a low-k dielectric material. Preferably, the dielectric layer 121 includes TEOS. Other suitable low-k dielectric materials may also be useful.

The process includes forming suitable one or more via openings (not shown) and one or more trenches in the MRAM region. One or more trenches are formed in the first upper dielectric layer 121 of the MRAM region. A photoresist (not shown) is applied to the top surface of the first upper dielectric layer to define a pattern arrangement for fabricating the trenches. Portions of the first upper dielectric layer not protected by the photoresist are removed (e.g., by using an etching process) to form the trenches. The etching process, for example, may be an anisotropic etch, such as RIE. Other suitable removal process may also be employed. The one or more trenches in the MRAM region, for example, include the depth dimension defined by, for example, 1× design rule.

The process continues by depositing a conductive layer on top of the first upper dielectric layer and fills the one or more trenches. The conductive layer, for example, may be formed by physical vapor deposition (PVD) and electroplating (ECP). The conductive layer, for example, includes Cu. Other suitable conductive materials and deposition techniques may also be employed. A chemical mechanical polishing (CMP) process is performed to remove excess conductive material on top of the first upper dielectric layer and to provide a substantially planar surface. The trench filled with conductive material forms a metal line 135 in the MRAM region. Although one metal line is shown in the MRAM region, it is understood that there could be more than one metal line being formed in the same metal level of the MRAM region. The metal line 135 may correspond to an interconnect in a metal level in the MRAM region which may be coupled to a MTJ element which will be formed later. As shown, the process forms metal line 135 in a metal level (e.g., M3) of the device.

Referring to FIG. 4a, a dielectric liner 141 is formed above the first upper dielectric layer covering the metal line 135 in the MRAM region. The dielectric liner, for example, serves as an etch stop layer. The dielectric liner may be a low k dielectric liner. For example, the dielectric liner may be NBLoK. Other suitable types of dielectric materials for the dielectric liner may also be useful. The dielectric liner, for example, is formed by CVD. Other suitable techniques for forming the dielectric liner may also be useful.

The process continues to form a second upper dielectric layer 122. As shown in FIG. 4a, the second upper dielectric layer 122 is formed on the first upper dielectric layer. For example, the second upper dielectric layer is formed on the dielectric liner 141. The second upper dielectric layer, in one embodiment, includes a low-k dielectric material. Preferably, the second upper dielectric layer 122 is formed of a low-k dielectric layer, such as TEOS. The second upper dielectric layer may be formed by CVD. Any other suitable forming techniques or suitable low-k materials and thicknesses for the second upper dielectric layer may also be useful.

In FIG. 4a, the second upper dielectric layer 122 and the dielectric liner 141 in the MRAM region are patterned to form one or more trench openings 430. In one embodiment, the opening 430 in the MRAM region includes sufficient depth to accommodate a bottom electrode which will be coupled to the MTJ element of the memory cell. Although a single opening is shown corresponding to a bottom electrode trench in the MRAM region, it is understood that there may be more than one bottom electrode trench. The trenches may be circular shape or may include other suitable shapes. The trenches may be formed by mask and etch techniques. For example, a patterned photoresist mask may be formed over the second upper dielectric layer, serving as an etch mask. An etch, such as RIE, may be performed to pattern the second upper dielectric layer and dielectric liner using the patterned resist etch mask. In one embodiment, the etch transfers the pattern of the mask to the second upper dielectric layer, including the dielectric liner to form the one or more trenches 430. As shown, the etch stops when it reaches a top surface of the metal line 135. The metal line 135, for example, serves as an etch stop for the trench opening 430.

The process continues by depositing a conductive layer over the second upper dielectric layer. For example, the conductive layer is conformally formed over a top surface of the second upper dielectric layer and fills the trench opening 430. The conductive layer, for example, may include Ti, TiN, Ta or TaN and may be formed by physical vapor deposition (PVD). Other suitable conductive materials and deposition techniques may also be employed. A CMP process is performed to remove excess conductive material on top of the second upper dielectric layer and to provide a substantially planar top surface. As shown in FIG. 4b, the CMP process removes the conductive layer and defines the bottom electrode 165.

The process continues to form MTJ stack of the MRAM cell. Various layers of the MTJ stack are formed on the second upper dielectric layer 122 as shown in FIG. 4c. For example, various layers of the MTJ stack of the MRAM cell are sequentially formed over the second upper dielectric layer in the MRAM region. The process forms various layers of the MTJ stack 464, a first top electrode layer 466a and a hard mask layer 468 over the second upper dielectric layer by PVD process. Other suitable techniques may also be used. The MTJ stack, for example, is shown to include four layers 464a-464d having materials the same as that described in FIG. 1. It is understood that the MTJ stack may include other suitable number of layers and other suitable materials. The first top electrode layer 466a, for example, may include the same material as the bottom electrode while the hard mask layer 468, for example, includes an oxide material.

The process continues to pattern the first top electrode layer 466a and upper layers 464c-464d of the MTJ stack as shown in FIG. 4c. Patterning the layers may be achieved with mask and etch techniques. A soft mask 470, such as a photoresist layer, is formed on the hard mask layer. The soft mask is patterned to form a pattern which is used to define the first or lower top electrode portion and upper MTJ layers.

As shown in FIG. 4d, the patterned mask 470 is used define the tunnel barrier 164d and free layer 164c of the MTJ stack and lower top electrode portion 166a of the MRAM cell and hard mask 168 by removing portions of the upper layers of the MTJ stack, top electrode layer and hard mask layer not protected by the patterned mask. As shown, the fixed layer and the tunnel barrier layer 464a-464b remain unetched at this stage. The patterned mask is removed using suitable techniques, such as ashing.

The process continues by depositing a dielectric liner 480 as shown in FIG. 4e. The dielectric liner 480 covers exposed surfaces of the top electrode and patterned MTJ layers while covering top surface of the tunneling barrier 464b. The dielectric liner 480, for example, may be formed by CVD and serves as an etch mask or protective layer during subsequent processing. The dielectric liner may be a low k dielectric liner. For example, the dielectric liner may be silicon nitride. Other suitable types of dielectric materials for the dielectric liner and forming techniques may also be useful.

Referring to FIG. 4f, the process continues to process the dielectric liner 480. For example, the dielectric liner 480 is patterned to remove horizontal portions, leaving vertical portions or spacers lining sidewalls of the patterned upper MTJ layers 164c-164d, top electrode 166a and hard mask 168. Removal can be achieved, for example, using a blanket dry etch, such as RIE. Other suitable techniques may also be useful. The process continues to define lower layers 464a-464b of the MTJ stack. In one embodiment, the etch to define the lower layers of the MTJ stack is highly selective to materials of the lower MTJ stack layers. As shown, the etch process defines the tunnel barrier 164b and the fixed layer 164a of the MTJ stack. The etch stops when it reaches the top surface of the second upper dielectric layer 122. As shown in FIG. 4f, the fixed layer 164a and the tunnel barrier 164b of the MTJ stack are defined without using an additional mask as the dielectric spacers 480 serve as the etch mask and protects the upper layers of the MTJ stack during the etch process. The fixed layer 164a and the tunnel barrier 164b of the MTJ stack as defined includes a length which is greater than the length of the free layer 164c and tunnel barrier 164d of the MTJ stack 164 and top electrode 166a such that it is easy for process control and to prevent electrical shorts between the top and bottom electrodes as well as to prevent electrical shorts between the free and fixed layers of the MTJ stack.

The process continues to form an encapsulation liner 182. The encapsulation liner, for example, includes the same material and is formed using the same technique as that described for the dielectric liner 480. As shown, the encapsulation liner covers exposed surfaces of the second upper dielectric layer 122, bottom electrode and the MTJ stack 164 including the dielectric spacers 480 disposed on sidewalls of the upper layers of the MTJ stack as shown in FIG. 4g.

A third upper dielectric layer 123 is formed. The third upper dielectric layer is formed over the encapsulation liner layer. The third upper dielectric layer, for example, includes a low-k dielectric material which is the same material as the second upper dielectric layer. The third upper dielectric layer may be formed by CVD and includes a thickness sufficient to cover the patterned MTJ stack 164 and top electrode 166a. Other suitable dielectric materials and techniques may be used for forming the third upper dielectric layer. A planarization process is performed to remove excess third upper dielectric layer. The planarization process, for example, may be achieved by CMP. Other suitable techniques may also be useful. The planarization process produces a substantially planar top surface. As shown, the planarization process removes a top portion of the encapsulation liner 182 and hard mask 168 until a top surface of the top electrode 166a is exposed as shown in FIG. 4h. The planarized third upper dielectric layer 123, for example, surrounds and covers the sides of the MTJ stack.

The process continues by providing a magnetic shield structure that substantially surrounds the MTJ stack. In one embodiment, the process continues by forming a magnetic shield in the form of a cylindrical structure that substantially surrounds the MTJ stack. Referring to FIG. 4i, the process continues by introducing a trench 435 through the third upper dielectric layer 123 and encapsulation liner 182. In one embodiment, the trench 435 is formed in the form of a cylindrical or annular trench surrounding or adjacent to the MTJ stack when viewed from top. In one embodiment, the trench 435 may be formed using suitable mask and etch technique. The trench, for example, is formed using a mask (not shown) and an anisotropic etch, such as RIE. In one embodiment, the trench 435 extends from the top surface of the third upper dielectric layer 123 and passes through the encapsulation liner 182. The trench 435, as shown, exposes a portion of the top surface of the second upper dielectric layer 122 and is isolated from the MTJ stack by a portion of the third upper dielectric layer. The trench, for example, includes a width of about 10-100 nm. Other suitable width dimensions may also be useful.

In FIG. 4j, a barrier layer (not shown) is formed to line the trench 435 and a seed layer 491 is provided to line the barrier layer. The barrier layer, for example, prevents diffusion of subsequently formed magnetic shield material into the dielectric layer while the seed layer promotes formation of the magnetic shield material. For example, the barrier layer includes Ti or Cr while the seed layer includes Ni or Fe. The barrier layer and the seed layer are formed, for example, using PVD. Other suitable barrier and seed materials and forming techniques may also be useful.

In one embodiment, the process 400 continues to form a magnetic shield layer 493 covering the third upper dielectric layer and completely fills the trench 435 as shown in FIG. 4k. The magnetic shield layer, for example, includes Ni, Fe or NiFe (M metal) layer. The magnetic shield layer may be formed by electrochemical deposition (plating) having a thickness of about 10-100 nm. Other suitable forming techniques and thicknesses may also be useful. Excess magnetic shield material may be removed by a planarization process, such as chemical mechanical polishing (CMP) to produce a substantially planar top surface. As shown, this forms a magnetic shield in the form of a cylindrical or annular ring structure 193 surrounding the MTJ stack when viewed from top. The top surface of the cylindrical magnetic shield structure 193 is substantially coplanar with a top surface of the third upper dielectric layer 123, encapsulation liner 182 and top electrode 166a as shown in FIG. 4l.

As shown, the top electrode 166a and the MTJ stack are formed in a MTJ level of an ILD level. The top electrode 166a and the MTJ stack 164 may not be sufficiently thick to match the height of a via contact to be formed in a logic region (not shown) disposed in the same substrate. In such case, the process 400, in one embodiment, continues to form an additional top electrode layer over the MRAM region. In one embodiment, the additional top electrode layer includes the same material as the first top electrode 166a and is formed using the same technique as described with respect to the top electrode 166a. The additional top electrode layer, for example, includes a sufficient thickness such that the total thickness of the additional top electrode 166b, top electrode 166a, MTJ stack 164 and the bottom electrode 165 in the MRAM region matches the desired height of the via contact to be formed in the logic region in the same via level. After the additional top electrode layer is formed, a patterned photoresist mask (not shown) may be formed over the additional top electrode layer in the MRAM region, serving as an etch mask. An etch, such as RIE, may be performed to pattern the additional top electrode layer using the patterned resist etch mask. In one embodiment, the etch removes exposed portions of the additional top electrode layer not protected by the etch mask, leaving a portion of the additional top electrode layer in the MRAM region as shown in FIG. 4m. As shown, the remaining additional top electrode layer 166b is sufficiently wide to be electrically connected to the underlying MTJ stack in the MRAM region. In such case, the remaining additional top electrode layer 166b disposed over the third upper dielectric layer may be referred to as an upper top electrode portion while the top electrode 166a having side surfaces aligned with side surfaces of upper MTJ stack layers 164c-164d may be referred to as a lower top electrode portion of the top electrode 166.

As shown in FIG. 4n, the process continues to form a fourth upper dielectric layer 125. The fourth upper dielectric layer, for example, includes a low-k dielectric material which is the same material as the second and third upper dielectric layers. The fourth upper dielectric layer may be formed by CVD and includes a thickness sufficient to cover the additional top electrode 166b and is sufficiently thick to accommodate a metal line or interconnect disposed in a metal level (e.g., M4). The second, third and fourth upper dielectric layers in combination, for example, corresponds to upper ILD level 4. Other suitable dielectric materials and techniques may be used for forming the fourth upper dielectric layer.

The process continues to form one or more damascene trench openings 433 as shown in FIG. 4n. By way of example, a removal process may be performed using suitable mask and etch technique to form the opening 433. The opening 433, for example, may be defined based on 2× design rule. The opening 433 may be formed by mask and etch techniques. The removal process, for example, may employ an etch which is highly selective to the material of the fourth dielectric layer to remove exposed portions of the dielectric layer to form the opening. As shown, the etch forms the trench 433 and stops when it reaches the top surface of the top electrode 166.

A conductive layer is formed. The conductive layer covers the dielectric layer 125 as well as filling the trench opening 433. The conductive layer should be sufficiently thick to fill the opening. The conductive layer, for example, includes copper. Other suitable conductive materials may also be useful. Excess conductive material is removed by CMP, forming a metal line 155 as shown in FIG. 4o. As shown, the top surface of the metal line is substantially planar with the top surface of the dielectric layer 125.

The process continues to complete formation of the IC. The process, for example, may continue to form passivation layer and pad interconnects or bonding/bump pads. Further processing can include final passivation, dicing, assembly and packaging. Other processes are also useful.

Figure 5A:
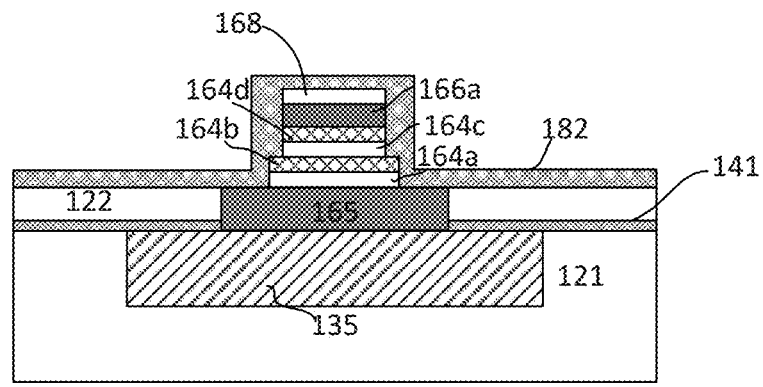
FIGS. 5a-5h show an exemplary embodiment of a process flow for forming a MTJ element or bit with a spacer shield structure.

FIGS. 5a-5h show cross-sectional views of another embodiment of a process flow 500 for forming a device. The device formed, for example, includes the magnetic shield configuration or structure 200b shown and described in FIG. 2b and the process 500 may contain similar steps as that described in FIGS. 4a-4o. In the interest of brevity, common elements may not be described or described in detail. As shown in FIG. 5a, the partially processed substrate is at the stage similar to that described in FIG. 4g. For example, the encapsulation liner 182 covers exposed surfaces of the second upper dielectric layer 122, bottom electrode 165, MTJ stack 164 and the hard mask 168.

Figure 5B:
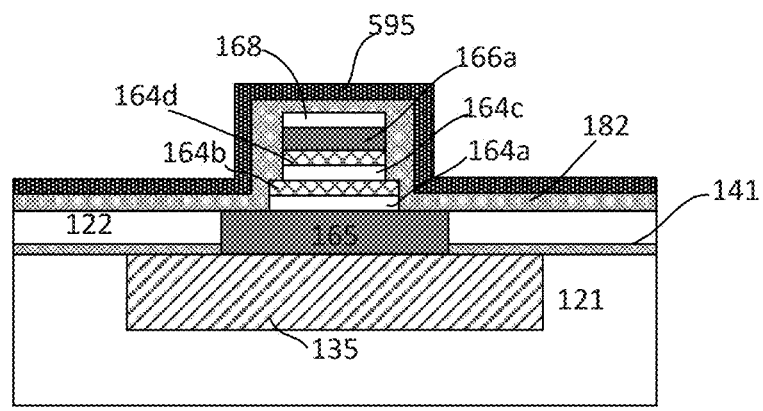

In one embodiment, the process continues by providing a magnetic shield structure that substantially surrounds the MTJ stack. In one embodiment, the process continues by forming a magnetic shield in the form of a magnetic shield spacer that substantially surrounds the MTJ stack. To form the magnetic shield structure, the process 500 continues to form a magnetic shield layer 595 covering the encapsulation liner 182 as shown in FIG. 5b. The magnetic shield layer, for example, includes the same or suitable magnetic shield material as described in FIG. 4k. The magnetic shield layer, for example, may be formed by PVD with a thickness of about 10-100 nm. Other suitable forming techniques and thicknesses may also be useful.

Figure 5C:
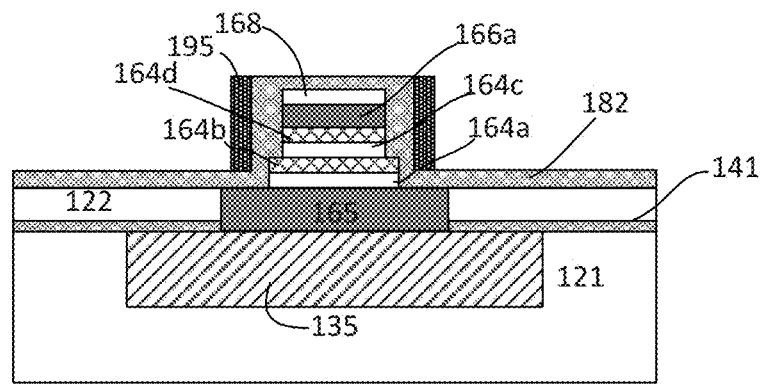

The process 500 continues to process the magnetic shield layer 595. Referring to FIG. 5c, the process continues by performing a blanket etch process, such as RIE, to remove horizontal portions of the magnetic shield layer, leaving vertical portions of the magnetic shield layer as magnetic shield spacer 195 surrounding the MTJ stack. For example, the magnetic shield structure in the form of magnetic shield spacer 195 lines and abuts sidewalls of the encapsulation liner 182. Other suitable techniques may also be used to remove horizontal portions of the magnetic shield layer. As shown, the magnetic shield spacer 195 includes a top surface that is substantially coplanar with the top surface of the encapsulation liner 182.

Figure 5D:
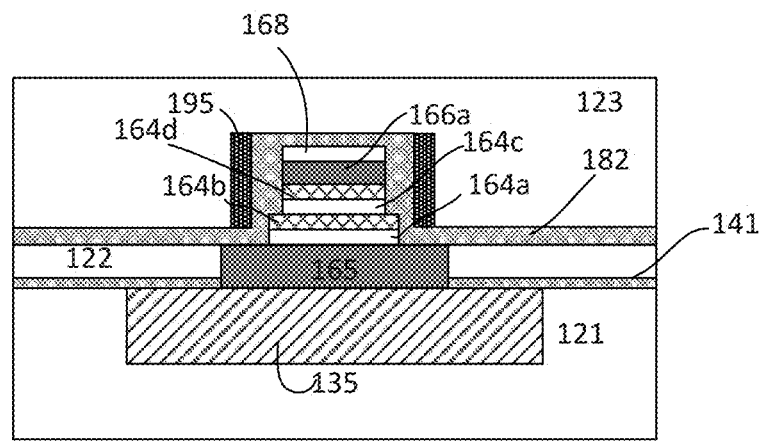
Figure 5E:
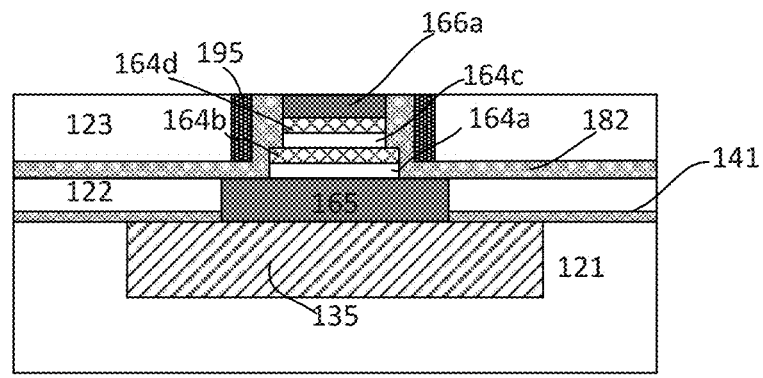

A third upper dielectric layer 123 is formed as shown in FIG. 5d. The third upper dielectric layer is formed over the encapsulation liner layer and the magnetic shield spacer. The third upper dielectric layer, for example, includes the same dielectric material as described in FIG. 4h. The third upper dielectric layer may be formed by CVD and includes a thickness sufficient to cover the encapsulation liner layer and the magnetic shield spacer. Other suitable dielectric materials and techniques may be used for forming the third upper dielectric layer. A planarization process is performed to remove excess third upper dielectric layer. The planarization process, for example, may be achieved by CMP. Other suitable techniques may also be useful. The planarization process produces a substantially planar top surface. As shown, the planarization process removes a top portion of the encapsulation liner 182, a top portion of the magnetic shield spacer 195 and the hard mask 168 until a top surface of the top electrode 166a is exposed as shown in FIG. 5e. The planarized third upper dielectric layer 123, for example, surrounds and covers the exposed sides of the magnetic shield spacer.

Figure 5F:
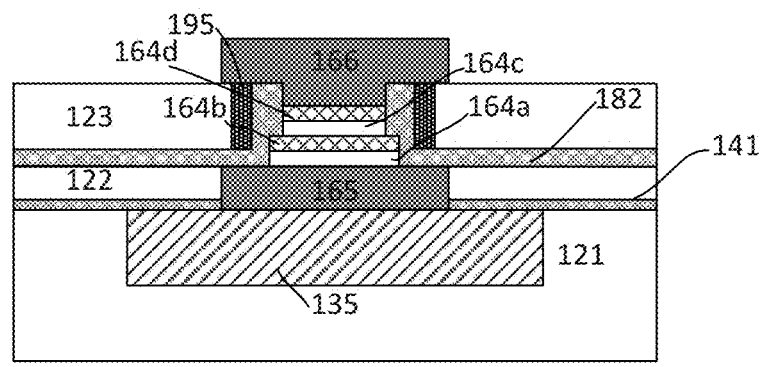

As described, the top electrode 166a and the MTJ stack may not be sufficiently thick to match the height of a via contact to be formed in the logic region (not shown). In such case, after the planarization process, the process 500 continues by forming an additional top electrode layer. The additional top electrode layer, for example, includes the same material and is processed by the same technique to form an upper top electrode portion 166b as described in FIG. 4m. The lower top electrode portion 166a and the upper top electrode portion 166b, in combination, corresponds to the top electrode 166 as shown in FIG. 5f.

Figure 5G:
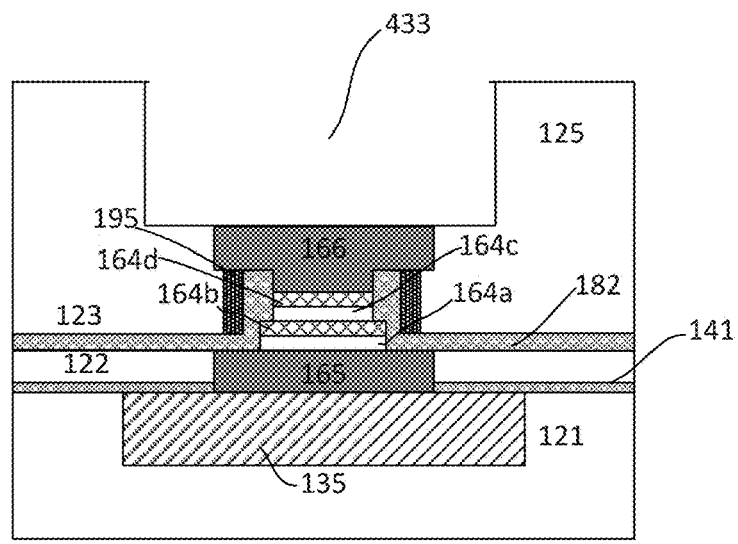
Figure 5H:
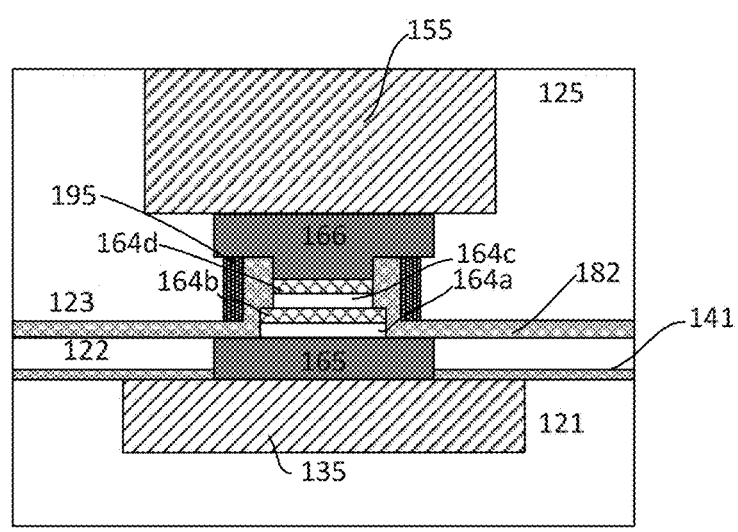

The process 500 continues to form a fourth upper dielectric layer 125 and to form one or more damascene trench openings 433 as shown in FIG. 5g which is then filled with conductive material to form one or more metal lines 155 as shown in FIG. 5h. For example, the process 500 continues as similarly described in FIG. 4n and onwards. As such, these process steps will not be described or described in detail. The process continues until a device similar to that shown in FIG. 2b is formed.

Figure 6A:
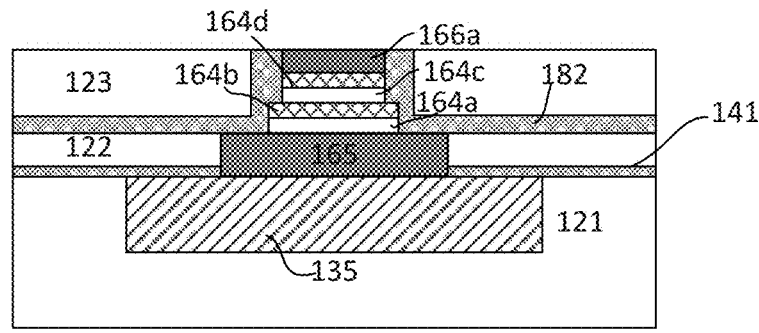
FIGS. 6a-6h show an exemplary embodiment of a process flow for forming a MTJ element or bit with a cylindrical shield structure with a top plate shield.

FIGS. 6a-6h show cross-sectional views of another embodiment of a process flow 600 for forming a device. The device formed, for example, includes the magnetic shield configuration or structure 200c shown and described in FIG. 2c and the process 600 may contain similar steps as that described in FIGS. 4a-4o. In the interest of brevity, common elements may not be described or described in detail. As shown in FIG. 6a, the partially processed substrate is at the stage similar to that described in FIG. 4h. For example, a planarization process is performed to remove a top portion of the encapsulation liner layer 182 and hard mask 168 until a top surface of the top electrode 166a is exposed.

In one embodiment, the process 600 continues by providing a magnetic shield structure that substantially surrounds the MTJ stack. In one embodiment, the process continues by forming a magnetic shield in the form of a cylindrical structure with a first (or top) plate shield that substantially surrounds the MTJ stack. To form the magnetic shield in the form of cylindrical structure with the top plate shield, the process continues to form a fourth upper dielectric layer 124. The fourth upper dielectric layer, for example, includes the same dielectric material as the third upper dielectric layer and may be formed by CVD having a thickness sufficient to cover the encapsulation liner layer and the MTJ stack. Other suitable dielectric materials and techniques may be used for forming the fourth upper dielectric layer.

Figure 6B:
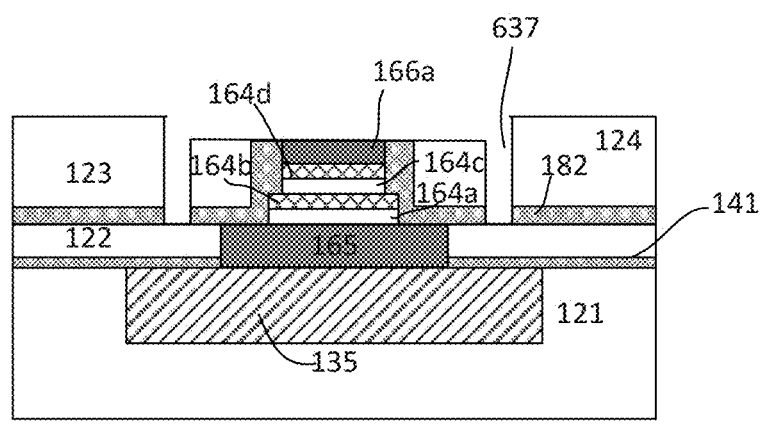

Referring to FIG. 6b, the process continues by introducing a dual damascene opening 637 through the third and fourth upper dielectric layers. In one embodiment, the dual damascene opening 637 includes a cylindrical or annular trench surrounding or adjacent to the MTJ stack which is the same as that described in FIG. 4i and an upper trench portion which is sufficiently deep to accommodate a top plate shield. In one embodiment, the dual damascene opening may be formed using suitable mask and etch technique. The dual damascene opening, for example, is formed using a mask (not shown) and an anisotropic etch, such as RIE. In one embodiment, the dual damascene opening extends from the top surface of the third and fourth upper dielectric layers and passes through the encapsulation liner 182. The annular trench of the dual damascene opening, as shown, exposes a portion of the top surface of the second upper dielectric layer and is isolated from the MTJ stack by a portion of the third upper dielectric layer while the upper trench portion exposes planar top surfaces of the encapsulation liner and top electrode 166a. The annular trench and the upper trench portion, as shown, include outer edges that are aligned to each other.

Figure 6C:
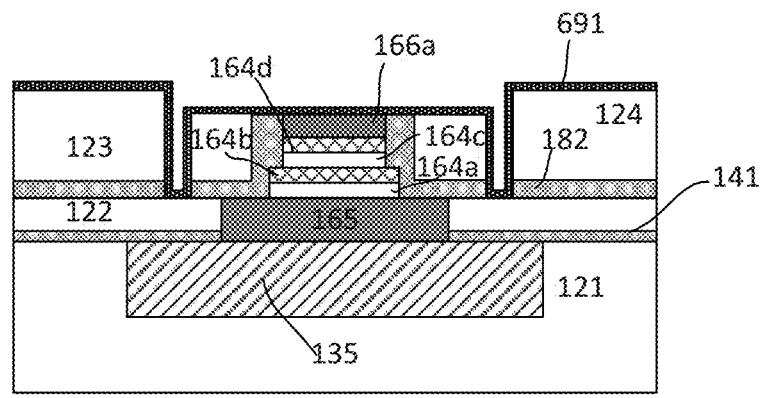

In FIG. 6c, a barrier layer (not shown) is formed to line the dual damascene opening 637 and a seed layer 691 is provided to line the barrier layer. The barrier layer and seed layer 691 include the same material as the barrier layer and seed layer 491 and are formed by the same technique as described in FIG. 4j.

Figure 6D:
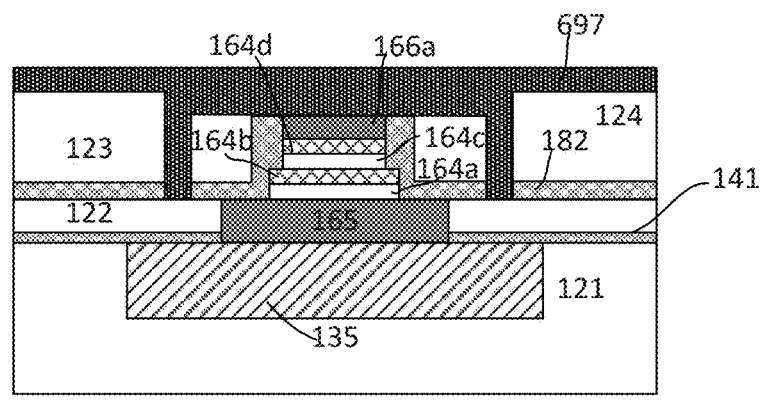
Figure 6E:
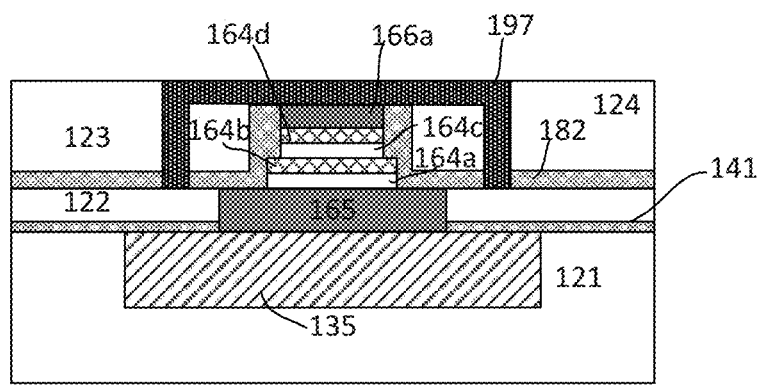

In one embodiment, the process 600 continues to form a magnetic shield layer 697 covering the fourth upper dielectric layer and completely fills the dual damascene opening 637 as shown in FIG. 6d. The magnetic shield layer 697, for example, includes the same material as the magnetic shield layer 493 as described in FIG. 4k and may be formed by electrochemical deposition (plating) having a thickness of about 10-100 nm. Other suitable forming techniques and thicknesses may also be useful. Excess magnetic shield material may be removed by a planarization process, such as CMP to produce a substantially planar top surface. As shown, this forms a magnetic shield in the form of a cylindrical or annular ring structure surrounding the MTJ stack with a top plate shield 197 when viewed from top. The top surface of the cylindrical magnetic shield structure with the top plate shield is substantially coplanar with a top surface of the fourth upper dielectric layer 124 as shown in FIG. 6e.

Figure 6F:
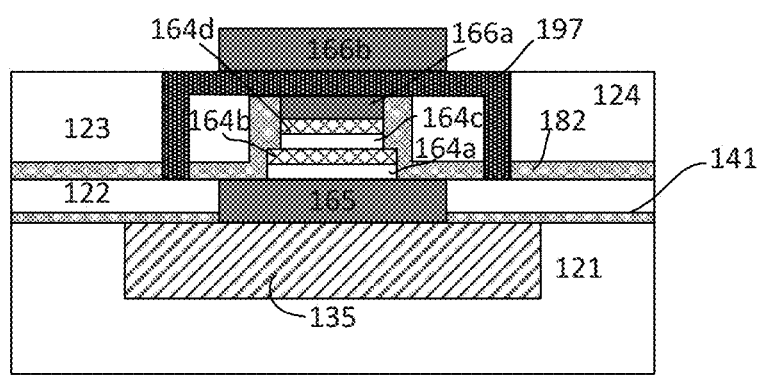

The process 600, in one embodiment, continues to form an additional top electrode layer over the MRAM region. In one embodiment, the additional top electrode layer includes the same material as the first top electrode 166a and is formed using the same technique as described with respect to the top electrode 166a. After the additional top electrode layer is formed, a patterned photoresist mask (not shown) may be formed over the additional top electrode layer in the MRAM region, serving as an etch mask. An etch, such as RIE, may be performed to pattern the additional top electrode layer using the patterned resist etch mask. In one embodiment, the etch removes exposed portions of the additional top electrode layer not protected by the etch mask, leaving a portion of the additional top electrode layer 166b in the MRAM region as shown in FIG. 6f. As shown, the remaining additional top electrode layer 166b is sufficiently wide and may be referred to as an upper top electrode portion while the top electrode 166a having side surfaces aligned with side surfaces of upper MTJ stack layers 164c-164d may be referred to as a lower top electrode portion. As shown, the upper top electrode portion is separated from the lower top electrode portion by the top plate shield of the magnetic shield structure.

Figure 6G:
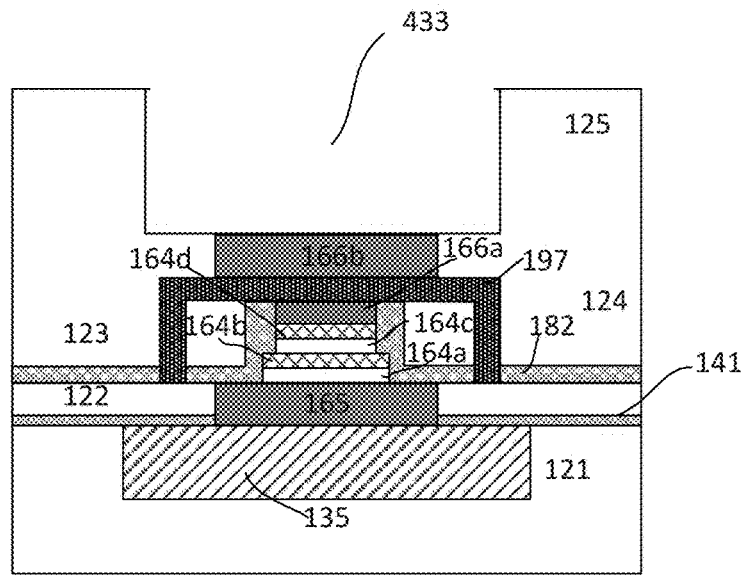
Figure 6H:
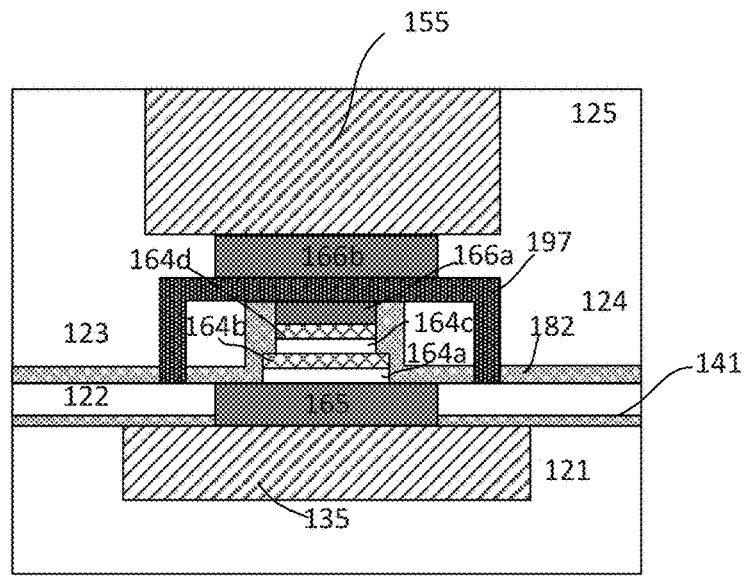

The process 600 continues to form a fifth upper dielectric layer 125 and to form one or more damascene trench openings 433 as shown in FIG. 6g which is then filled with conductive material to form one or more metal lines 155 as shown in FIG. 6h. For example, the process 600 continues as similarly described in FIG. 4n and onwards. As such, these process steps will not be described or described in detail. The process continues until a device similar to that shown in FIG. 2c is formed.

Figure 7A:
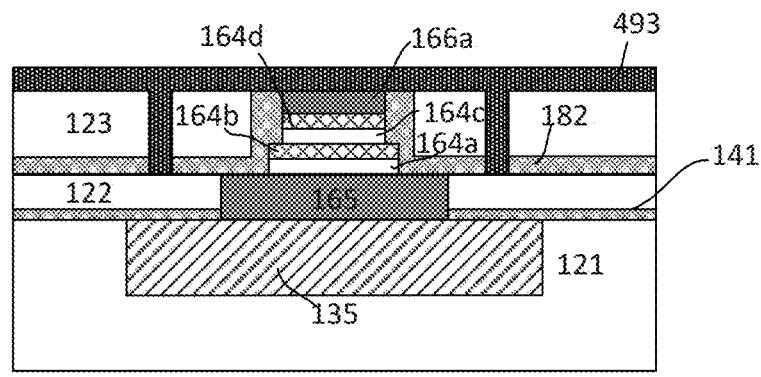
FIGS. 7a-7e show another exemplary embodiment of a process flow for forming a MTJ element or bit with a cylindrical shield structure with a top plate shield.

FIGS. 7a-7e show cross-sectional views of another embodiment of a process flow 700 for forming a device. The device formed, for example, includes the magnetic shield configuration or structure 200d shown and described in FIG. 2d and the process 700 may contain similar steps as that described in FIGS. 4a-4o. In the interest of brevity, common elements may not be described or described in detail. As shown in FIG. 7a, the partially processed substrate is at the stage similar to that described in FIG. 4k. For example, a magnetic shield layer 493 covering the third upper dielectric layer is formed and completely fills the annular trench 435.

Figure 7B:
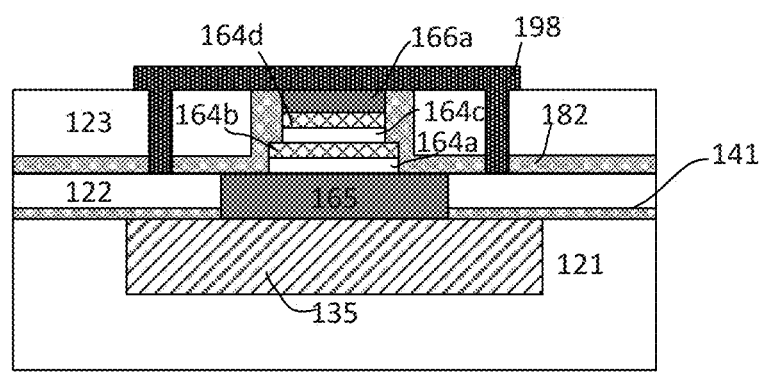

In one embodiment, the process 700 continues by providing a magnetic shield structure that substantially surrounds the MTJ stack. In one embodiment, the process continues by forming a magnetic shield in the form of a cylindrical structure with a first (or top) plate shield that substantially surrounds the MTJ stack. To form the magnetic shield in the form of cylindrical structure with the top plate shield, the process continues to define the top plate shield. For example, a patterned photoresist mask (not shown) may be formed over the magnetic shield layer 493 in the MRAM region, serving as an etch mask. An etch, such as RIE, may be performed to pattern the magnetic shield layer using the patterned resist etch mask. In one embodiment, the etch removes exposed portions of the magnetic shield layer not protected by the etch mask, leaving a portion of the magnetic shield layer which is disposed over the third upper dielectric layer as shown in FIG. 7b. This forms a magnetic shield structure in the form of a cylindrical shield structure with top plate shield 198. As shown, the top plate shield disposed over the third upper dielectric layer is sufficiently wide and has an outer edge that does not aligned with outer edge of the cylindrical shield portion. For example, the top plate shield has an outer edge that extends beyond the outer edge of the cylindrical shield portion.

Figure 7C:
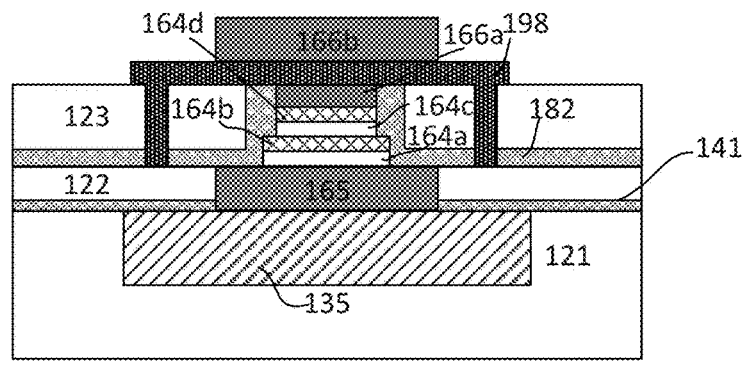

The process 700, in one embodiment, continues to form an additional top electrode layer over the MRAM region. In one embodiment, the additional top electrode layer includes the same material as the first top electrode 166a and is formed using the same technique as described with respect to the top electrode 166a. After the additional top electrode layer is formed, a patterned photoresist mask (not shown) may be formed over the additional top electrode layer in the MRAM region, serving as an etch mask. An etch, such as RIE, may be performed to pattern the additional top electrode layer using the patterned resist etch mask. In one embodiment, the etch removes exposed portions of the additional top electrode layer not protected by the etch mask, leaving a portion of the additional top electrode layer 166b in the MRAM region as shown in FIG. 7c. As shown, the remaining additional top electrode layer 166b is sufficiently wide and may be referred to as an upper top electrode portion while the top electrode 166a having side surfaces aligned with side surfaces of upper MTJ stack layers 164c-164d may be referred to as a lower top electrode portion. As shown, the upper top electrode portion is separated from the lower top electrode portion by the top plate shield of the magnetic shield structure.

Figure 7D:
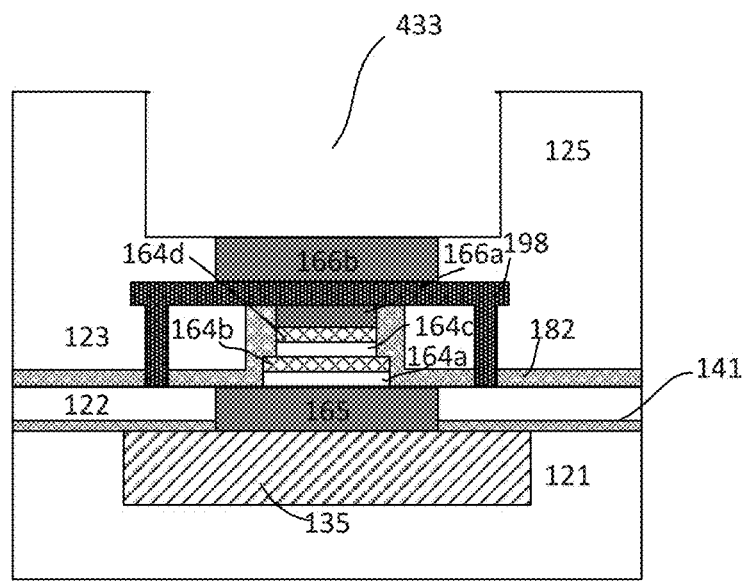
Figure 7E:
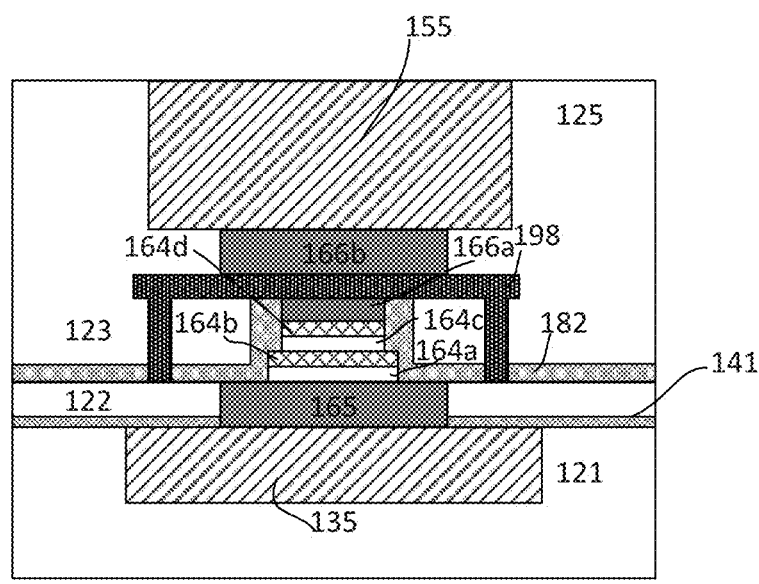

The process 700 continues to form a fourth upper dielectric layer 125 and to form one or more damascene trench openings 433 as shown in FIG. 7d which is then filled with conductive material to form one or more metal lines 155 as shown in FIG. 7e. For example, the process 700 continues as similarly described in FIG. 4n and onwards. As such, these process steps will not be described or described in detail. The process continues until a device similar to that shown in FIG. 2d is formed.

Figure 8A:
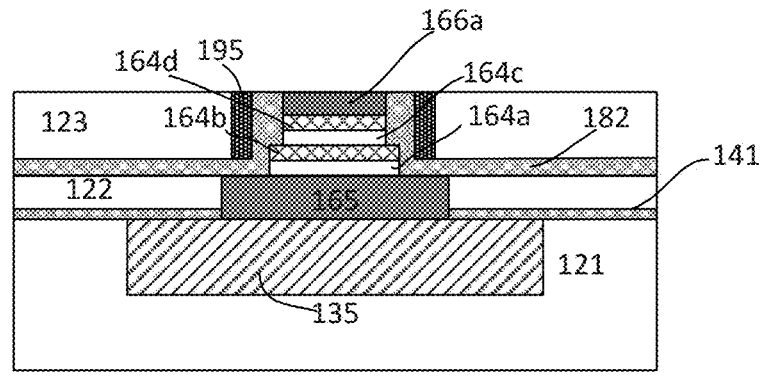
FIGS. 8a-8d show an exemplary embodiment of a process flow for forming a MTJ element or bit with a spacer shield structure with a top plate shield.

FIGS. 8a-8d show cross-sectional views of another embodiment of a process flow 800 for forming a device. The device formed, for example, includes the magnetic shield configuration or structure 200e shown and described in FIG. 2e and the process 800 may contain similar steps as that described in FIGS. 4a-4o and FIGS. 5a-5h. In the interest of brevity, common elements may not be described or described in detail. As shown in FIG. 8a, the partially processed substrate is at the stage similar to that described in FIG. 5e. For example, a magnetic shield in the form of magnetic shield spacer 195 is formed surrounding the MTJ stack. The magnetic shield spacer lines and abuts sidewall of the encapsulation liner and has a top surface that is substantially coplanar with the top surfaces of the encapsulation liner and top electrode 166a.

Figure 8B:
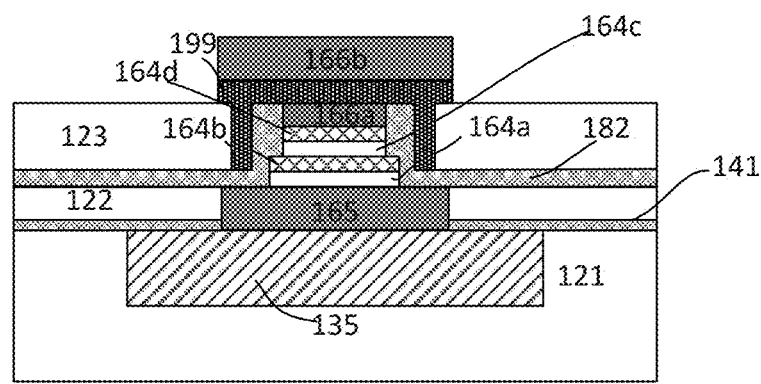

In one embodiment, the process continues to form a magnetic shield layer over the third upper dielectric layer 123 and an additional top electrode layer formed over the magnetic shield layer. The magnetic shield layer and the top electrode layer, for example, include the same material as the magnetic shield layer and top electrode layer as described in FIG. 4k and FIG. 4m respectively and are formed by PVD. A patterned photoresist mask (not shown) may be formed over the additional top electrode layer, serving as an etch mask. An etch, such as RIE, may be performed to pattern the additional top electrode layer and magnetic shield layer using the patterned resist etch mask. In one embodiment, the etch removes exposed portions of the additional top electrode layer and magnetic shield layer not protected by the etch mask, leaving a portion of the additional top electrode layer 166b and magnetic shield layer 199 which corresponds to the top plate shield in the MRAM region as shown in FIG. 8b. As shown, the remaining additional top electrode layer 166b is sufficiently wide and may be referred to as an upper top electrode portion while the top electrode 166a having side surfaces aligned with side surfaces of upper MTJ stack layers 164c-164d may be referred to as a lower top electrode portion. As shown, the upper top electrode portion is separated from the lower top electrode portion by the top plate shield 199. In this embodiment, the top plate shield and the cylindrical shield portion are formed separately.

Figure 8C:
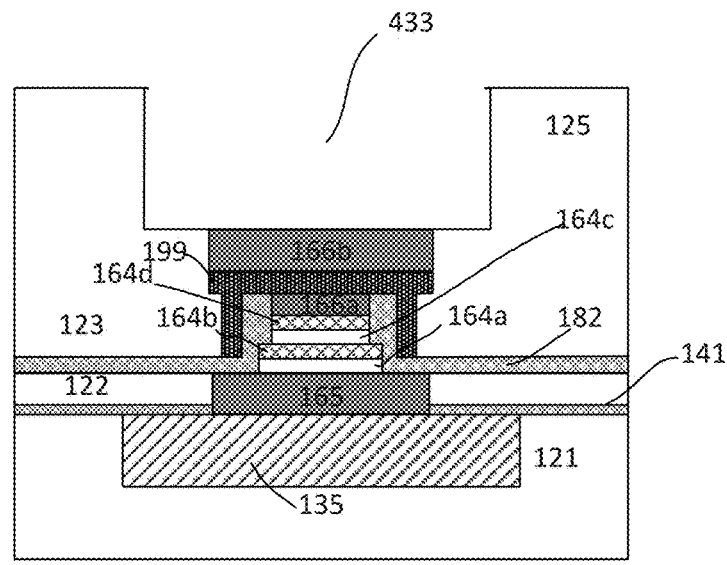
Figure 8D:
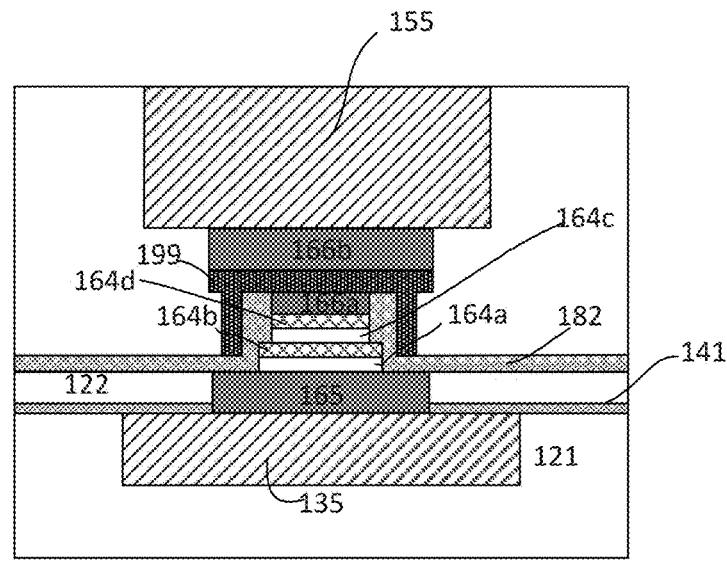

The process 800 continues to form a fourth upper dielectric layer 125 and to form one or more damascene trench openings 433 as shown in FIG. 8c which is then filled with conductive material to form one or more metal lines 155 as shown in FIG. 8d. For example, the process 800 continues as similarly described in FIG. 4n and onwards. As such, these process steps will not be described or described in detail. The process continues until a device similar to that shown in FIG. 2e is formed.

Figure 9A:
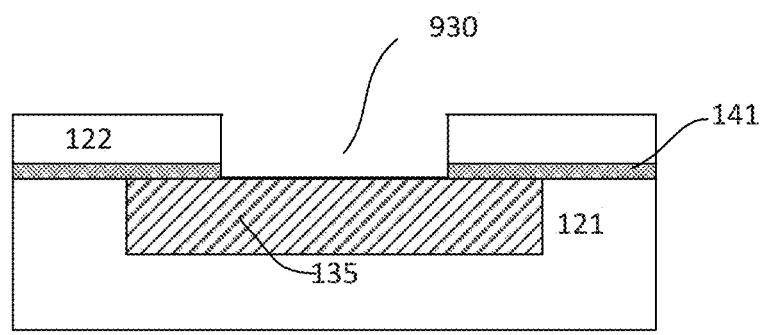
FIGS. 9a-9k show an exemplary embodiment of a process flow for forming a MTJ element or bit with a cylindrical shield structure with top and bottom shields.

FIGS. 9a-9k show cross-sectional views of another embodiment of a process flow 900 for forming a device. The device formed, for example, includes the magnetic shield configuration or structure 200f shown and described in FIG. 2f and the process 900 may contain similar steps as that described in FIGS. 4a-4o and FIGS. 6a-6h. In the interest of brevity, common elements may not be described or described in detail. As shown in FIG. 9a, the partially processed substrate is at the stage similar to that described in FIG. 4a. For example, the second upper dielectric layer 122 and the dielectric liner 141 in the MRAM region are patterned to form one or more trench openings 930. In one embodiment, the opening 930 in the MRAM region includes sufficient depth to accommodate at least a bottom electrode which will be coupled to the MTJ element of the memory cell.

Figure 9B:
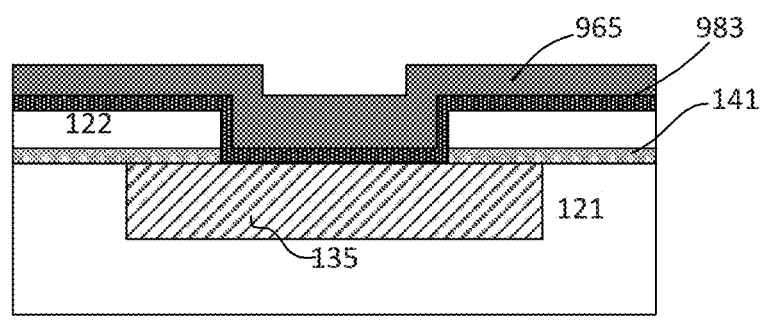

In one embodiment, the process 900 continues by providing a magnetic shield structure that substantially surrounds the MTJ stack. In one embodiment, the process continues by forming a magnetic shield in the form of a cylindrical structure with a first (or top) plate shield and a second (or bottom) plate shield that substantially surrounds the MTJ stack. To form the bottom plate shield, a magnetic shield layer 983 is conformally formed over the second upper dielectric layer 122 lining the trench opening 930 while a bottom electrode layer 965 is conformally formed over the magnetic shield layer 983 as shown in FIG. 9b. The magnetic shield layer 983 and the bottom electrode layer 965 include the same magnetic shield layer 493 and conductive material as described in FIG. 4k and FIG. 4b respectively and may be formed by PVD and electroplating (ECP). Other suitable magnetic shield and bottom electrode materials and forming techniques may also be useful.

Figure 9C:
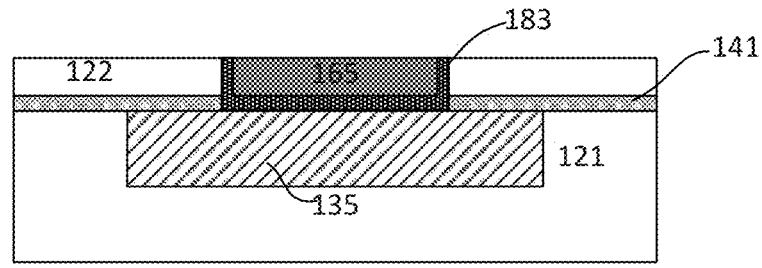

Referring to FIG. 9c, a planarization process, such as CMP, is performed to remove excess conductive material and magnetic shield material on top of the second upper dielectric layer and to provide a substantially planar top surface. As shown in FIG. 9c, the CMP process removes the excess conductive layer and magnetic shield layer and defines the bottom electrode 165 and the bottom plate shield 183. Thus, the trench opening 930 is sufficiently deep to accommodate the bottom plate shield and the bottom electrode. The bottom plate shield, as shown, lines the sidewalls and bottom of the trench opening.

Figure 9D:
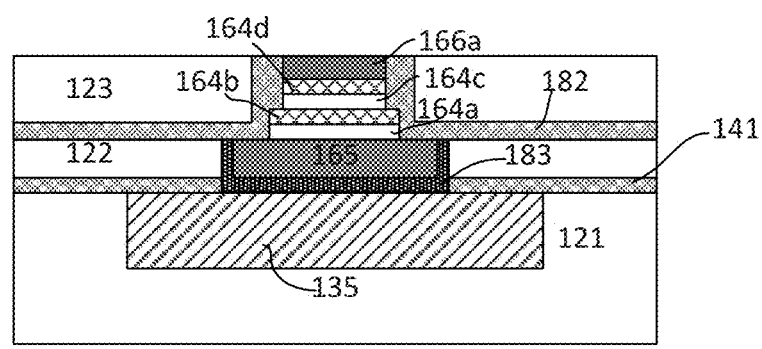

The process 900 continues by performing the processing as described in FIGS. 4c to 4h. For example, the process 900 continues to define the MTJ stack 164, forming the encapsulation liner 182, third upper dielectric layer 123 and planarizing the layers until a partially processed structure as shown in FIG. 9d is formed. As shown, the first top electrode 166a is exposed and the top surfaces of the third upper dielectric layer, encapsulation liner and the top electrode 166a are substantially coplanar with each other.

Figure 9E:
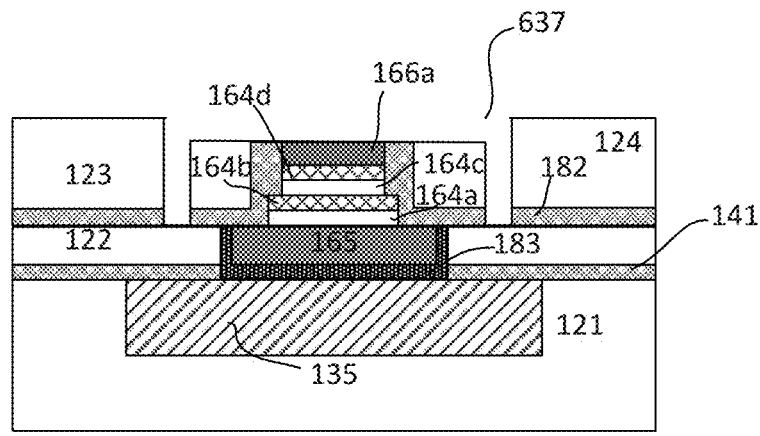
Figure 9F:
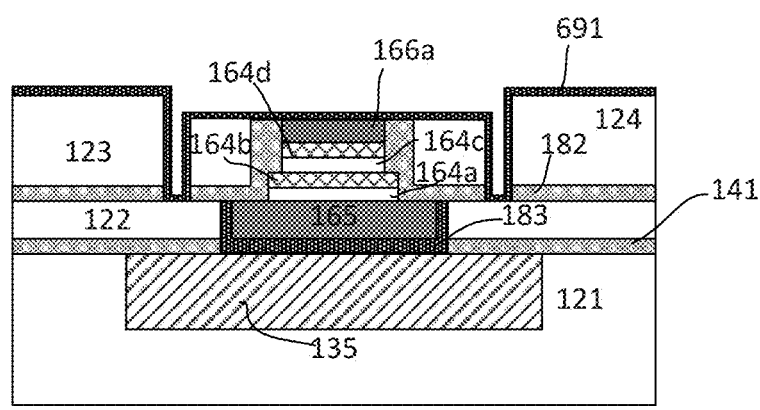
Figure 9G:
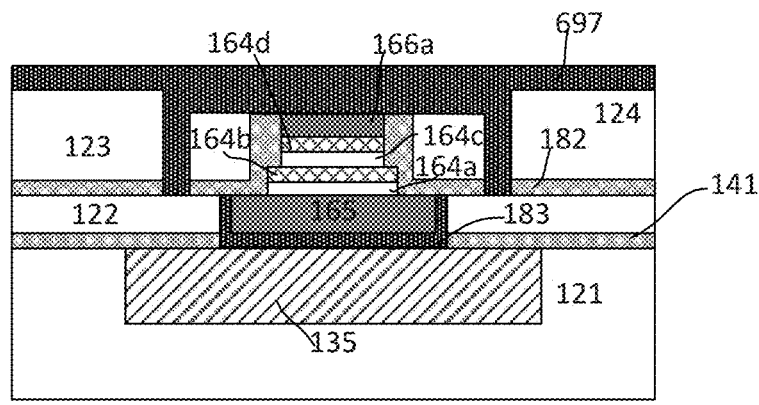
Figure 9H:
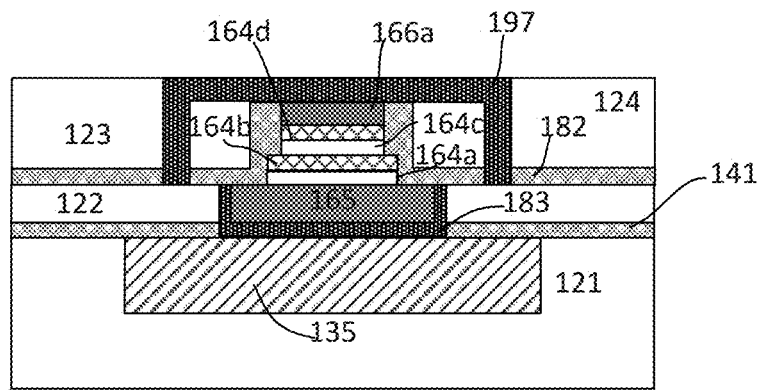

In one embodiment, the process 900 continues by forming a magnetic shield in the form of a cylindrical structure with a first (or top) plate shield that substantially surrounds the MTJ stack. To form the magnetic shield in the form of cylindrical structure with the top plate shield, the process continues by performing the processing as described in FIGS. 6b to 6e. For example, the process 900 continues by depositing a fourth upper dielectric layer 124 and forming a dual damascene opening 637 as shown in FIG. 9e, forming barrier layer and seed layer 691 as shown in FIG. 9f, providing a magnetic shield layer 697 over the fourth upper dielectric layer and fills the dual damascene opening as shown in FIG. 9g, and removing excess magnetic shield material by a planarization process, such as CMP, to produce a substantially planar top surface as shown in FIG. 9h. The materials and the processing techniques are the same as that described in FIGS. 6b to 6e. This forms a magnetic shield in the form of a cylindrical or annular ring with a first (or top) plate shield 197 and a second (or bottom) plate shield 183 surrounding the MTJ stack.

Figure 9I:
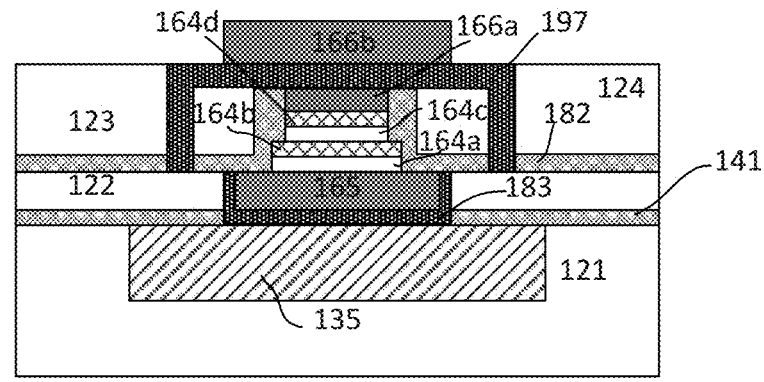
Figure 9J:
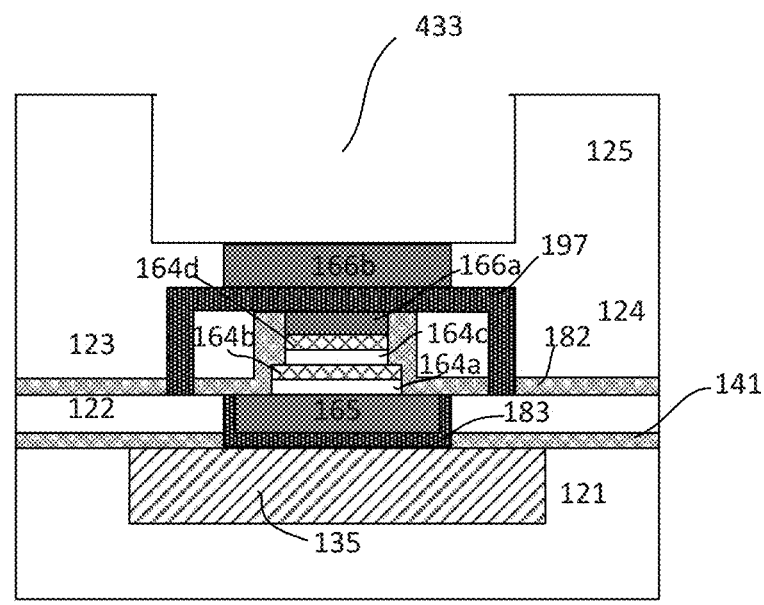
Figure 9K:
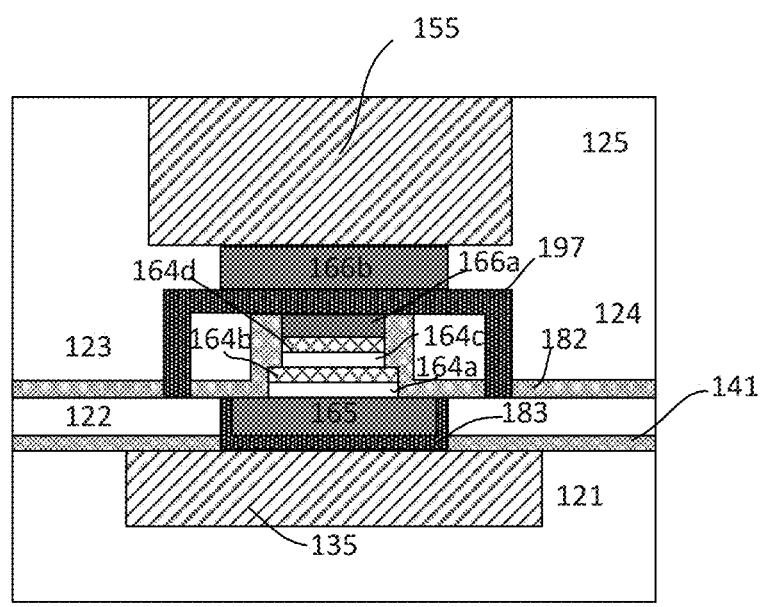

The process 900 continues to define an additional top electrode 166b as shown in FIG. 9i, to form a fifth upper dielectric layer 125 and to form one or more damascene trench openings 433 as shown in FIG. 9j which is then filled with conductive material to form one or more metal lines 155 as shown in FIG. 9k. For example, the process 900 continues as similarly described in FIG. 6f and onwards. As such, these process steps will not be described or described in detail. The process continues until a device similar to that shown in FIG. 2f is formed.

Figure 10A:
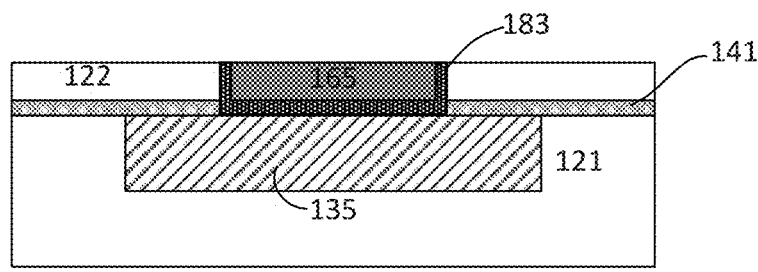
FIGS. 10a-10i show an exemplary embodiment of a process flow for forming a MTJ element or bit with a spacer shield structure with top and bottom shields.

FIGS. 10a-10i show cross-sectional views of another embodiment of a process flow 1000 for forming a device. The device formed, for example, includes the magnetic shield configuration or structure 200g shown and described in FIG. 2g and the process 1000 may contain similar steps as that described in FIGS. 4a-4o, FIGS. 5a-5h, FIGS. 8a-8d and FIGS. 9a-9k. In the interest of brevity, common elements may not be described or described in detail. As shown in FIG. 10a, the partially processed substrate is at the stage similar to that described in FIG. 9c. For example, the bottom electrode 165 and the bottom plate shield 183 are defined in the trench opening 930.

Figure 10B:
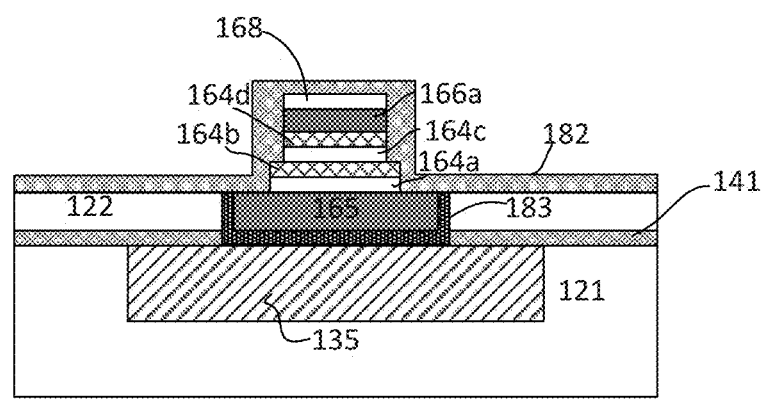

The process 900 continues by performing the processing as described in FIGS. 4c to 4g. For example, the process 1000 continues to define the hard mask 168 and MTJ stack 164, and forming the encapsulation liner 182 until a partially processed structure as shown in FIG. 10b is formed. As shown, the encapsulation liner layer 182 covers the second upper dielectric layer 122, the patterned hard mask 168 and MTJ stack 164.

Figure 10C:
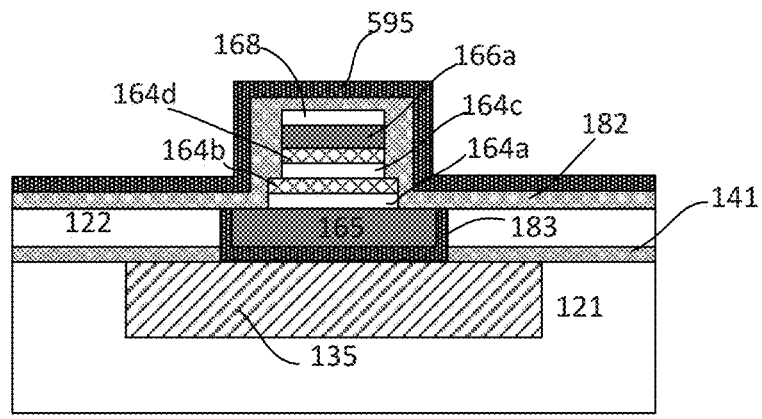
Figure 10D:
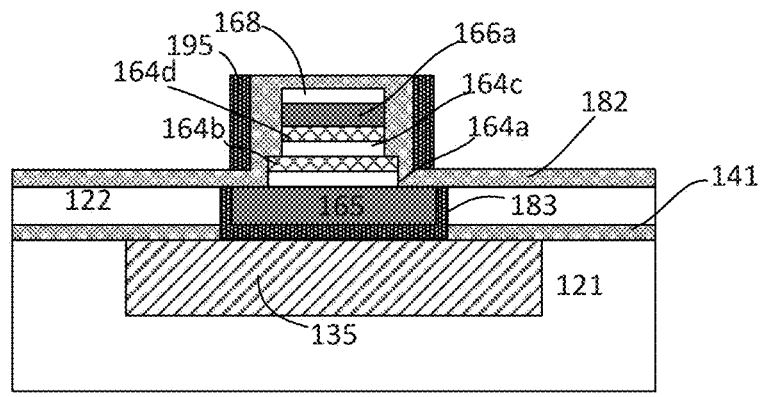
Figure 10E:
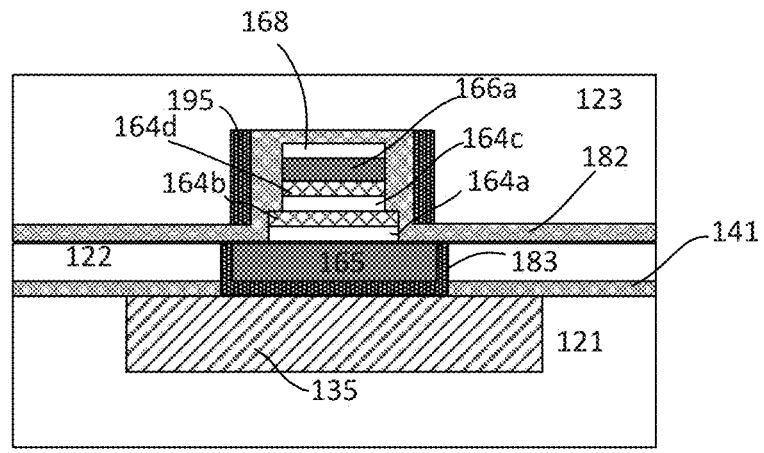
Figure 10F:
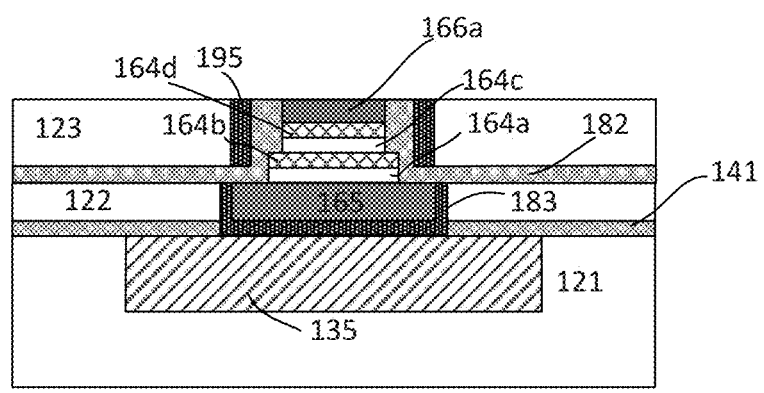

In one embodiment, the process 1000 continues by forming a magnetic shield in the form of magnetic shield spacer that abuts the encapsulation liner and substantially surrounds the MTJ stack. To form the magnetic shield in the form of magnetic shield spacer 195, the process continues by performing the processing as described in FIGS. 5b to 5e. For example, the process 1000 continues by depositing a magnetic shield layer 595 as shown in FIG. 10c, performing a blanket etch process, such as RIE to form magnetic shield spacer lining sidewalls of the encapsulation liner 182 as shown in FIG. 10d, providing a third upper dielectric layer 123 covering the magnetic shield spacer and top surface of the encapsulation liner as shown in FIG. 10e, and removing excess third upper dielectric layer, encapsulation liner and magnetic shield spacer and completely removes the hard mask 168 by a planarization process, such as CMP, to produce a substantially planar top surface with top surface of the top electrode 166a exposed as shown in FIG. 10f. The materials and the processing techniques are the same as that described in FIGS. 5b to 5e.

Figure 10G:
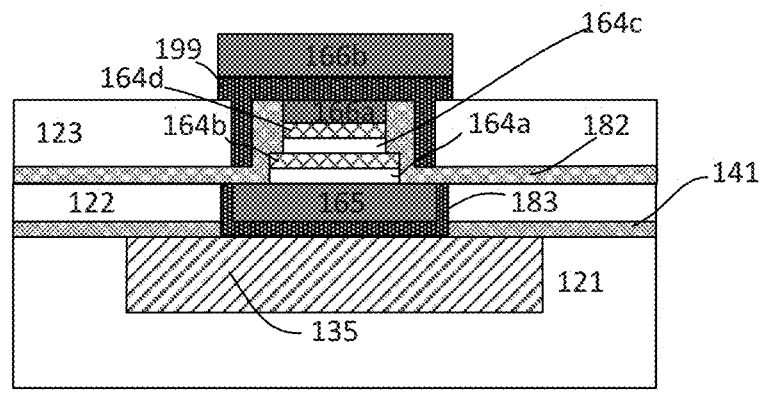

In one embodiment, the process 1000 continues by forming a first (or top) plate shield 199 and an additional top electrode 166b. To form the top plate shield, the process continues by performing the processing as described in FIG. 8b. For example, the process 1000 continues by depositing a magnetic shield layer and an additional top electrode layer, and patterning these layers to define the top plate shield and additional top electrode as shown in FIG. 10g. The materials and the processing techniques are the same as that described in FIG. 8b. As shown, this forms a magnetic shield in the form of a magnetic shield spacer with a first (or top) plate shield 199 and a second (or bottom) plate shield 183 surrounding the MTJ stack.

Figure 10H:
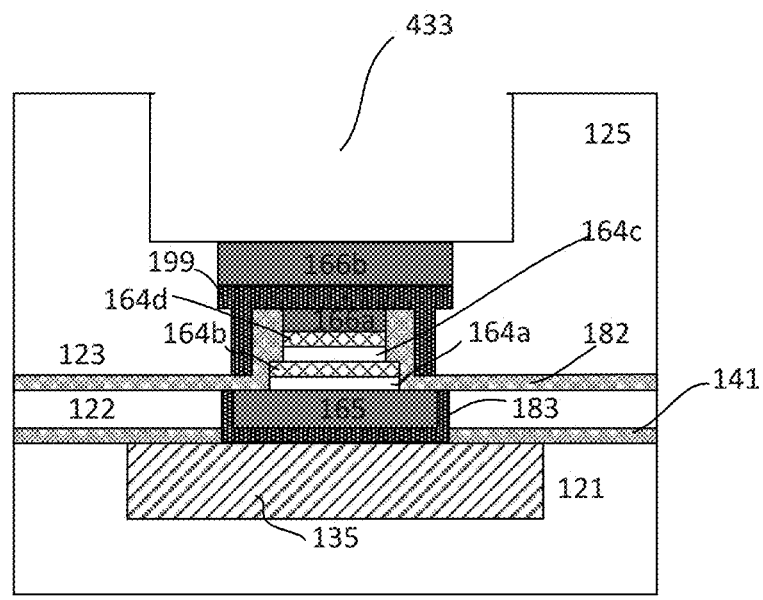
Figure 10I:
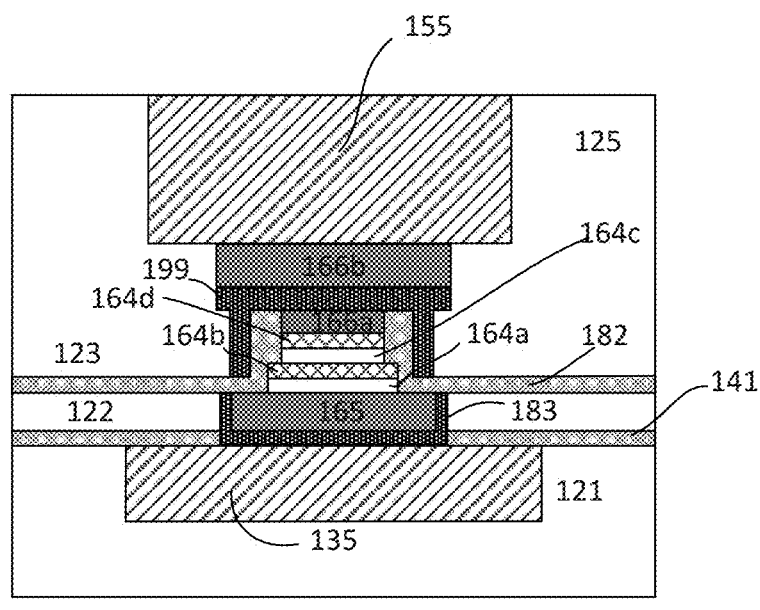

The process 1000 continues to form a fourth upper dielectric layer 125 and to form one or more damascene trench openings 433 as shown in FIG. 10h which is then filled with conductive material to form one or more metal lines 155 as shown in FIG. 10i. For example, the process 1000 continues as similarly described in FIG. 8c and onwards. As such, these process steps will not be described or described in detail. The process continues until a device similar to that shown in FIG. 2g is formed.

For illustration purpose, the device and the process as described and shown include one memory cell. However, it is understood that the device may include numerous memory cells integrated into the same IC. Although as described, the MTJ element is disposed in specified ILD level of the back end dielectric layer, other configurations may also be useful. For example, the MTJ element may be disposed in other suitable ILD level.

The embodiments as described in this disclosure result in various advantages. For example, the MRAM chips or dies as described have one or more magnetic shield structures disposed substantially surrounding or adjacent to the MTJ element within the chip. One or more magnetic shield dispositions and different combinations of the dispositions may be contemplated herein. Furthermore, the disclosed methods protect the one or more MTJ elements of the MRAM chips or dies from global external and local magnetic fields. These methods of forming the MRAM chips are easy in fabrication and are highly compatible with complementary metal oxide semiconductor (CMOS) process flow. The cycle time is lower compared to individual die-packaging level magnetic shielding. The process may be performed without requiring additional or new manufacture tooling.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A magnetic random access memory (MRAM) chip comprising:
    a substrate having first and second surfaces, wherein the first surface is defined with a MRAM region;
    an upper inter level dielectric (ILD) layer disposed over the first surface of the substrate, wherein the upper ILD layer comprises a plurality of ILD levels;

a magnetic storage element having a magnetic tunneling junction (MTJ) array with MTJ stack disposed in between top and bottom electrodes in the MRAM region, wherein the magnetic storage element is disposed in a dielectric layer in between adjacent ILD levels of the upper ILD layer;

at least a magnetic shield structure disposed in the same dielectric layer as the MTJ stack, wherein the magnetic shield structure is in the form of a side shield structure with a top plate shield that substantially surrounds the MTJ stack, wherein the top plate shield is in contact with the side shield structure, and wherein the side shield structure and the top plate shield include a same magnetic shield material; and a pad level disposed over the magnetic storage element, wherein the pad level comprises a die bond/bump pad coupled to the magnetic storage element.

2. The MRAM chip of claim 1 wherein the side shield structure is in the form of a cylindrical side shield structure that substantially surrounds the MTJ stack.

3. The MRAM chip of claim 2 wherein the cylindrical side shield structure is isolated from the MTJ by a portion of dielectric material of the dielectric layer.

4. The MRAM chip of claim 2 wherein:
the top electrode comprises a lower top electrode portion and an upper top electrode portion; and wherein the top plate shield is disposed in between the lower and upper top electrode portions of the top electrode.

5. The MRAM chip of claim 4 wherein outer edge of the top plate shield is aligned with outer edge of the cylindrical side shield structure of the magnetic shield structure.

6. The MRAM chip of claim 4 wherein outer edge of the top plate shield extends beyond outer edge of the cylindrical side shield structure of the magnetic shield structure.

7. The MRAM chip of claim 4 wherein:
the magnetic shield structure further comprises a bottom plate shield that is disposed below the MTJ stack.

8. The MRAM chip of claim 1 comprising an encapsulation liner which lines exposed sidewalls of the MTJ stack.

9. The MRAM chip of claim 8 wherein the side shield structure is in the form of a magnetic shield spacer that substantially surrounds the MTJ stack, and wherein the magnetic shield spacer abuts sidewall of the encapsulation liner.

10. The MRAM chip of claim 1 wherein:
the top electrode comprises a lower top electrode portion and an upper top electrode portion; and wherein the top plate shield is disposed in between the lower and upper top electrode portions of the top electrode.

11. The MRAM chip of claim 10 wherein:
the magnetic shield structure further comprises a bottom plate shield that is disposed below the MTJ stack.

12. The MRAM chip of claim 1 wherein the magnetic shield material includes Nickel (Ni), Iron (Fe) or Nickel-Iron alloy (NiFe).

13. A magnetic random access memory (MRAM) chip comprising:
a substrate having first and second surfaces, wherein the first surface is defined with a MRAM region;
an upper inter level dielectric (ILD) layer disposed over the first surface of the substrate, wherein the upper ILD layer comprises a plurality of ILD levels;
a magnetic storage element having a magnetic tunneling junction (MTJ) array with MTJ stack disposed in between top and bottom electrodes in the MRAM region, wherein the magnetic storage element is disposed in a dielectric layer in between adjacent ILD levels of the upper ILD layer; and at least a magnetic shield structure disposed in the same dielectric layer as the MTJ stack, wherein the magnetic shield structure comprises a bottom magnetic shield covering the MTJ stack and a side magnetic shield substantially surrounding the MTJ stack, and wherein the bottom magnetic shield is disposed below the MTJ stack in a trench which accommodates the bottom electrode, and wherein the bottom magnetic shield and the side magnetic shield include a same magnetic shield material.

14. The MRAM chip of claim 13 wherein the side magnetic shield is in the form of a cylindrical side magnetic shield that surrounds the MTJ stack; and
is isolated from the MTJ by a portion of dielectric material of the dielectric layer.

15. The MRAM chip of claim 14 wherein the magnetic shield structure further comprises a top magnetic shield, and wherein the top magnetic shield is a substantially planarized top plate shield that disposed between a lower top electrode portion and an upper top electrode portion of the top electrode.

16. The MRAM chip of claim 13 further comprises an encapsulation liner disposed over exposed sidewalls of the MTJ stack and exposed surface of the bottom electrode.

17. The MRAM chip of claim 16 wherein the side magnetic shield
is disposed over the encapsulation liner; and
is in the form of magnetic shield spacer that substantially surrounds the MTJ stack.

18. The MRAM chip of claim 17 wherein the top magnetic shield is a substantially planarized top plate shield that disposed between a lower top electrode portion and an upper top electrode portion of the top electrode.

19. The MRAM chip of claim 13 wherein the magnetic shield structure includes Nickel (Ni), Iron (Fe) or Nickel-Iron alloy (NiFe).

20. A magnetic random access memory (MRAM) chip comprising:
a substrate having first and second surfaces, wherein the first surface is defined with a MRAM region;
an upper inter level dielectric (ILD) layer disposed over the first surface of the substrate, wherein the upper ILD layer comprises a plurality of ILD levels;
a magnetic storage element having a magnetic tunneling junction (MTJ) array with MTJ stack disposed in between top and bottom electrodes in the MRAM region, wherein the magnetic storage element is disposed in a dielectric layer in between adjacent ILD levels of the upper ILD layer, and wherein the top electrode comprises a lower top electrode portion and an upper top electrode portion; and
at least a magnetic shield structure disposed in the same dielectric layer as the MTJ stack, wherein the magnetic shield structure is in the form of a side shield structure with a top plate shield that substantially surrounds the MTJ stack, and wherein the top plate shield is disposed in between the lower and upper top electrode portions of the top electrode.

* * * * *